(12) United States Patent
Tokunaga et al.

(10) Patent No.: US 12,449,732 B2
(45) Date of Patent: Oct. 21, 2025

(54) COMPOSITION FOR FORMING RESIST UNDERLAYER FILM WITH IMPROVED FILM DENSITY

(71) Applicant: NISSAN CHEMICAL CORPORATION, Tokyo (JP)

(72) Inventors: Hikaru Tokunaga, Toyama (JP); Masashi Ohno, Funabashi (JP); Rikimaru Sakamoto, Toyama (JP); Keisuke Hashimoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/097,523

(22) PCT Filed: Apr. 25, 2017

(86) PCT No.: PCT/JP2017/016406
§ 371 (c)(1),
(2) Date: Oct. 29, 2018

(87) PCT Pub. No.: WO2017/188263
PCT Pub. Date: Nov. 2, 2017

(65) Prior Publication Data
US 2019/0137878 A1    May 9, 2019

(30) Foreign Application Priority Data
Apr. 28, 2016 (JP) ................ 2016-091528

(51) Int. Cl.
| | |
|---|---|
| G03F 7/09 | (2006.01) |
| C08G 12/08 | (2006.01) |
| C08G 12/26 | (2006.01) |
| G03F 7/26 | (2006.01) |
| H01L 21/027 | (2006.01) |
| H01L 21/033 | (2006.01) |

(52) U.S. Cl.
CPC ............ G03F 7/094 (2013.01); C08G 12/08 (2013.01); C08G 12/26 (2013.01); G03F 7/26 (2013.01); H01L 21/0271 (2013.01); H01L 21/0332 (2013.01)

(58) Field of Classification Search
CPC .......... G03F 7/094; C08G 8/24; C09D 161/12
See application file for complete search history.

(56) References Cited

U.S. PATENT DOCUMENTS

2012/0077345 A1* 3/2012 Saito .............. C08L 79/02
528/270
2014/0235059 A1* 8/2014 Sakamoto .......... C08L 79/04
438/702
2015/0184018 A1* 7/2015 Endo ............... G03F 7/038
524/594
2015/0316850 A1* 11/2015 Someya .............. G03F 7/091
438/703
2017/0205711 A1* 7/2017 Fujitani ............ C09D 161/06

FOREIGN PATENT DOCUMENTS

| CN | 103827159 A | 5/2014 |
|---|---|---|
| CN | 104541205 A | 4/2015 |
| JP | 2014-029435 A | 2/2014 |
| WO | 2010/147155 A1 | 12/2010 |
| WO | 2012/077640 A1 | 6/2012 |
| WO | 2013/005797 A1 | 1/2013 |
| WO | 2013/047516 A1 | 4/2013 |
| WO | 2014/007079 A1 | 1/2014 |
| WO | 2014/030579 A1 | 2/2014 |
| WO | 2014/092155 A1 | 6/2014 |
| WO | 2016/013598 A1 | 1/2016 |

OTHER PUBLICATIONS

Jul. 11, 2017 Search Report issued in International Patent Application No. PCT/JP2017/016406.
Jul. 11, 2017 Written Opinion issued in International Patent Application No. PCT/JP2017/016406.
Oct. 6, 2022 Office Action issued in Taiwanese Patent Application No. 106114321.
Aug. 31, 2022 Rejection Decision issued in Chinese Patent Application No. 201780025989.3.
Dec. 8, 2023 Office Action issued in Taiwanese Patent Application No. 112127612.
Apr. 29, 2025 Office Action issued in Chinese Patent Application No. 201780025989.3.

* cited by examiner

Primary Examiner — Daborah Chacko-Davis
(74) Attorney, Agent, or Firm — Oliff PLC

(57) ABSTRACT

A resist underlayer film formation composition including a novolak resin that has a repeating unit structure represented by the following formula (1). (In formula (1), groups A and B are organic groups which each have an aromatic ring, a fused aromatic ring, or a fused aromatic heterocycle and have a structure in which two or more mono- or divalent chemical groups selected from the group consisting of chemical groups (a) that cause an increase in mass upon oxidation, groups (b) that form a crosslink upon heating, and groups (c) that induce phase separation during curing have replaced hydrogen atoms on the ring(s) contained in group A and/or B.) The composition further includes a crosslinking agent and an acid and/or acid generator. A production process is provided in which the resist underlayer film formation composition is applied to a semiconductor substrate and burned to obtain a resist underlayer film.

4 Claims, No Drawings

COMPOSITION FOR FORMING RESIST UNDERLAYER FILM WITH IMPROVED FILM DENSITY

TECHNICAL FIELD

The present invention relates to a composition for forming a resist underlayer film with improved film density and a method for producing a semiconductor apparatus using the composition.

BACKGROUND ART

Various polymerizations of polymer resins have been investigated. In particular, a polymer including a cyclic structure such as novolak has been widely used from the field of fine processing involved in a photoresist and the like to the field of general processing involved in parts for automobiles and houses. Such a polymer has high heat resistance and is applicable to special applications. Therefore, development of the polymer is presently progressed. As a monomer including a cyclic structure, a structure such as benzene, naphthalene, anthracene, pyrene, and fluorene is generally known. It is known that the monomer forms a novolak with a monomer having an aldehyde group. On the other hand, a carbazole having a structure similar to fluorene has also similar characteristics. It is obvious that a part of a benzene ring adjacent to a five-membered ring in each of the monomer and the carbazole is reacted to obtain a polymer.

Further, in production of a semiconductor apparatus, microprocessing by lithography using a photoresist composition has been conventionally carried out. The microprocessing is a processing method in which a thin film of the photoresist composition is formed on a substrate to be processed such as a silicon wafer, irradiated with active light such as ultraviolet light through a mask pattern on which a pattern of the semiconductor device is formed, and developed, and the substrate to be processed such as a silicon wafer is etched using the obtained photoresist pattern as a protective film. In recent years, an increase in degree of integration of the semiconductor device has advanced, the wavelength of used active light tends to shorten from a KrF excimer laser (248 nm) to an ArF excimer laser (193 nm). Therefore, diffuse reflection of active light on the substrate and effects of standing wave are severe problems. A method for providing an anti-reflective coating between the photoresist and the substrate to be processed has been widely studied.

When formation of finer resist pattern further proceeds, a problem of resolution and a problem in which the resist pattern collapses after development occur. Therefore, a decrease in film thickness of the resist is desired. In this case, it is difficult to obtain a resist pattern film thickness sufficient for substrate processing. A process of imparting a function of a mask during substrate processing to not only the resist pattern but also a resist underlayer film that is formed between the resist and a semiconductor substrate to be processed is required. As such a resist underlayer film for processing, a resist underlayer film for lithography having a selection ratio of dry etching rate close to that of the resist, which is different from a conventional resist underlayer film having high etching rate (in which the etching rate is high), a resist underlayer film for lithography having a lower selection ratio of dry etching rate than that of the resist, and a resist underlayer film for lithography having a lower selection ratio of dry etching rate than that of the semiconductor substrate are required.

Examples of the polymer for a resist underlayer film includes the followings.

Resist underlayer film-forming compositions each using carbazole are given as examples (see, for example, Patent Document 1, Patent Document 2, Patent Document 3, and Patent Document 4)

PRIOR ART DOCUMENTS

Patent Documents

Patent Document 1 International Publication No. WO 2010147155
Patent Document 2 International Publication No. WO 2012077640
Patent Document 3 International Publication No. WO 2013005797
Patent Document 4 International Publication No. WO 2014092155

SUMMARY OF THE INVENTION

Problem to be Solved by the Invention

The present invention intends to provide a resist underlayer film-forming composition for use in a lithography process of semiconductor apparatus production using a novolak resin. Moreover, the present invention intends to provide a resist underlayer film for lithography, the film not causing intermixing with a resist layer, having high dry-etching resistance, having high heat resistance, and producing a small amount of sublimate.

Further, the present invention intends to provide a resist underlayer film-forming composition for forming a resist underlayer film having high film density, hardness, Young's modulus, and wiggling resistance (resistance of pattern to bending) and therefore having high etching resistance based thereupon.

Means for Solving the Problem

The present invention is, as a first aspect, a resist underlayer film-forming composition comprising a novolak resin having a repeating unit structure of the following formula (1):

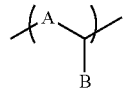

Formula (1)

(wherein a group A and a group B are each independently an organic group having an aromatic ring, a condensed aromatic ring, or a condensed aromatic hetero ring and having a structure in which two or more same or different mono- or divalent chemical groups selected from the group consisting of chemical groups (a) that cause an increase in mass upon oxidation, chemical groups (b) that form a crosslink upon heating, and chemical groups (c) that induce phase separation during curing are each substituted for a hydrogen atom bonded to a carbon atom on the aromatic ring, the condensed aromatic ring, or the condensed aromatic hetero ring in the group A or the group B, or both the two; and when the chemical groups are divalent, the rings are optionally bonded through the chemical groups or condensed together with the chemical groups);

as a second aspect, the resist underlayer film-forming composition according to the first aspect, wherein the organic group having an aromatic ring, a condensed aromatic ring, or a condensed aromatic hetero ring is an organic group having one or more benzene rings, naphthalene rings, or condensed rings of a benzene ring and a hetero ring;

as a third aspect, the resist underlayer film-forming composition according to the first or the second aspect, wherein the novolak resin of formula (1) is a novolak resin having a structure in which two or more chemical groups selected from the chemical groups (a), the chemical groups (b), the chemical groups (c), combinations of the chemical groups (a) and the chemical groups (b), combinations of the chemical groups (a) and the chemical groups (c), combinations of the chemical groups (b) and the chemical groups (c), and combinations of the chemical groups (a), the chemical groups (b), and the chemical groups (c) are each substituted for a hydrogen atom in the aromatic ring, the condensed aromatic ring, or the condensed aromatic hetero ring;

as a fourth aspect, the resist underlayer film-forming composition according to the third aspect, wherein the novolak resin of formula (1) has a structure in which two chemical groups are introduced in a unit structure in such a way that two same or different chemical groups selected from the chemical groups (b) or two chemical groups selected from both the chemical groups (a) and chemical groups (b) are each substituted for at least one hydrogen atom bonded to a carbon atom on the aromatic ring, the condensed aromatic ring, or the condensed aromatic hetero ring in both the group A and group B;

as a fifth aspect, the resist underlayer film-forming composition according to any one of the first aspect to the fourth aspect, wherein the chemical group (a) is methyl group, sulfide group, or a combination thereof;

as a sixth aspect, the resist underlayer film-forming composition according to any one of the first aspect to the fifth aspect, wherein the chemical group (b) is amino group, carboxyl group, a carboxylic acid alkyl ester group, nitro group, hydroxy group, ether group, or a combination thereof:

as a seventh aspect, the resist underlayer film-forming composition according to any one of the first aspect to the sixth aspect, wherein the chemical group (c) is a fluoroalkyl group;

as an eighth aspect, the resist underlayer film-forming composition according to any one of the first aspect to the seventh aspect, further comprising a crosslinker;

as a ninth aspect, the resist underlayer film-forming composition according to any one of the first aspect to the eighth aspect, further comprising an acid and/or an acid generator;

as a tenth aspect, a method for producing a resist underlayer film, the method comprising applying and baking the resist underlayer film-forming composition according to any one of the first aspect to the ninth aspect on a semiconductor substrate so as to obtain the resist underlayer film;

as an eleventh aspect, a method for producing a semiconductor apparatus, the method comprising: a step of forming a resist underlayer film from the resist underlayer film-forming composition according to any one of the first aspect to the ninth aspect on a semiconductor substrate; a step of forming a resist film on the resist underlayer film; a step of forming a resist pattern through irradiation with light or an electron beam and development; a step of etching the underlayer film with the formed resist pattern; and a step of processing the semiconductor substrate with the patterned underlayer film; and as a twelfth aspect, a method for producing a semiconductor device, the method comprising: a step of forming a resist underlayer film from the resist underlayer film-forming composition according to any one of the first aspect to the ninth aspect on a semiconductor substrate; a step of forming a hard mask on the resist underlayer film; a step of further forming a resist film on the hard mask; a step of forming a resist pattern through irradiation with light or an electron beam and development; a step of etching the hard mask with the formed resist pattern; a step of etching the underlayer film with the patterned hard mask; and a step of processing the semiconductor substrate with the patterned resist underlayer film.

Effects of the Invention

According to the resist underlayer film-forming composition of the present invention, a favorable resist pattern shape can be formed without causing intermixing between an upper layer portion of a resist underlayer film and a layer with which the upper layer portion is coated.

To the resist underlayer film-forming composition of the present invention, performance of efficiently suppressing reflection from a substrate can be imparted, and the resist underlayer film-forming composition of the present invention can also have an effect as an anti-reflective coating against exposure light.

According to the resist underlayer film-forming composition of the present invention, an excellent resist underlayer film having a dry etching rate selection ratio which is close to that of a resist, which is smaller than that of a resist, or which is smaller than that of a semiconductor substrate can be provided.

To prevent collapse of a resist pattern after development, thinning of a resist film is performed accompanying the formation of a finer resist pattern. With respect to such a thin film resist, there are: a process in which a resist pattern is transferred to an underlayer film for the thin film resist by an etching process, and a substrate processing is performed using the underlayer film as a mask; and a process in which a step of transferring a resist pattern to an underlayer film for the thin film resist by an etching process, and further transferring the pattern which has been transferred to the underlayer film to another underlayer film for the underlayer film using a different gas composition is repeated, and finally substrate processing is performed. The resist underlayer film and the resist underlayer film-forming composition of the present invention are effective for these processes and have sufficient etching resistance to a substrate to be processed (for example, thermally oxidized silicon film, silicon nitride film, polysilicon film, and the like on a substrate) when a substrate is processed using the resist underlayer film of the present invention.

The resist underlayer film of the present invention can be used as a flattening film, a resist underlayer film, an anti-fouling film for a resist layer, and a film having dry etching selectivity. Thereby, resist pattern formation in a lithography process of semiconductor production becomes able to be performed easily with good precision.

There is a process in which: a resist underlayer film is formed from the resist underlayer film-forming composition according to the present invention on a substrate; a hard mask is formed on the resist underlayer film; a resist film is formed on the hard mask; a resist pattern is formed through exposure and development; the resist pattern is transferred to the hard mask; the resist pattern that has been transferred to the hard mask is transferred to the resist underlayer film; and processing of a semiconductor substrate is performed with the resist underlayer film. In this process, there are: a case where the hard mask is formed from an application type composition which contains an organic polymer or inorganic polymer, and a solvent; and a case where the hard mask is formed by vacuum vapor deposition of an inorganic substance. In the vacuum vapor deposition of an inorganic substance (for example, silicon oxide nitride), a deposit is accumulated on a resist underlayer film surface, and the temperature of the resist underlayer film surface rises to around 400° C. on that occasion. In the present invention, the polymer to be used has extremely high heat resistance, and therefore thermal degradation does not occur even due to the accumulation of the deposit.

In the resist underlayer film obtained from the resist underlayer film-forming composition of the present invention, a chemical group having a particular function is substituted for a hydrogen atom bonded to a carbon atom on an aromatic ring, a condensed aromatic ring, or a condensed aromatic hetero ring (for example, benzene ring) in a unit structure of a polymer contained in the resist underlayer film, and therefore the film density and hardness are enhanced more, the wiggling resistance (resistance of pattern to bending) is higher, and the etching resistance is also enhanced more than those in a resist underlayer film having a polymer containing in a unit structure an aromatic ring, a condensed aromatic ring, or a condensed aromatic hetero ring which is not substituted with the chemical group.

MODES FOR CARRYING OUT THE INVENTION

The present invention is a resist underlayer film-forming composition comprising a novolak resin having a repeating unit of formula (1).

In formula (1), a group A and a group B are each independently an organic group having an aromatic ring, a condensed aromatic ring, or a condensed aromatic hetero ring and having a structure in which two or more mono- or divalent chemical groups selected from chemical groups (a) that cause an increase in mass upon oxidation, chemical groups (b) that form a crosslink upon heating, and chemical groups (c) that induce phase separation during curing are each substituted for a hydrogen atom bonded to a carbon atom on the aromatic ring, the condensed aromatic ring, or the condensed aromatic hetero ring in the group A or the group B, or both the two. When the chemical groups are divalent, the rings are optionally bonded through the chemical groups or condensed together with the chemical groups.

The aromatic ring, the condensed aromatic ring, or the condensed aromatic hetero ring can be one or more benzene rings, naphthalene rings, or condensed rings of a benzene ring and a hetero ring. Accordingly, the group A and the group B can each independently be an organic group having one or more benzene rings, naphthalene rings, or condensed rings of a benzene ring and a hetero ring.

Preferably, examples of the organic group A in formula (1) include organic groups each having benzene, naphthalene, carbazole, diphenylamine, tris(hydroxyphenyl)ethane, or the like. The amino group contained in carbazole and diphenylamine corresponds to the chemical group (b) and has a structure in which a secondary amino group is substituted for a hydrogen atom contained in two benzene rings. Tris(hydroxyphenyl)ethane has a structure in which each of the benzene rings is substituted with hydroxy group.

Examples of the organic group B in formula (1) include organic groups each having benzene, naphthalene, or the like.

As two or more chemical groups as described herein, there are: a case where two or more chemical groups are selected from the chemical groups (a); a case where two or more chemical groups are selected from the chemical groups (b); a case where two or more chemical groups are selected from the chemical groups (c); a case where two or more chemical groups are selected from both the chemical groups (a) and the chemical groups (b); a case where two or more chemical groups are selected from both the chemical groups (a) and the chemical groups (c); a case where two or more chemical groups are selected from both the chemical groups (b) and the chemical groups (c), or a case where two or more chemical groups are selected from all of the chemical groups (a), the chemical groups (b), and the chemical groups (c) (namely, three or more chemical groups).

The novolak resin of formula (1) can be a novolak resin having a structure in which two or more chemical groups selected from the chemical groups (a), the chemical groups (b), a combination of the chemical group (a) and the chemical group (b), a combination of the chemical group (a) and the chemical group (c), a combination of the chemical group (b) and the chemical group (c) are each substituted for a hydrogen atom in the aromatic ring, the condensed ring, or the condensed aromatic hetero ring. That is, the novolak resin can have a structure in which hydrogen atoms in the aromatic ring, the condensed aromatic ring, or the condensed aromatic hetero ring in the group A, the group B, or both the two are replaced.

In addition, the novolak resin of formula (1) can have a structure in which two chemical groups are introduced in the unit structure thereof in such a way that any one of the two chemical groups selected from the chemical groups (b) or a combination of the chemical group (a) and the chemical group (b) is substituted for one hydrogen atom bonded to a carbon atom on the aromatic ring, the condensed aromatic ring, or the condensed aromatic hetero ring in all of the aromatic rings, the condensed aromatic rings, or the condensed aromatic hetero rings (namely, in both the group A and the group B) in the unit structure.

Examples of the chemical group (a) include methyl group, sulfide group, or a combination thereof.

Examples of the chemical group (b) include amino group, carboxyl group, a carboxylic acid alkyl ester group, nitro group, hydroxy group, ether group, or a combination thereof.

Examples of the alkyl group in the carboxylic acid alkyl ester group include $C_{1-10}$ alkyl groups, and examples of the $C_{1-10}$ alkyl groups include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the chemical group (c) include a fluoroalkyl group. Examples of the fluoroalkyl group include a partially fluorinated alkyl group and a completely fluorinated alkyl group. Examples thereof include trifluoromethyl group.

In the present invention, the polymer is obtained by forming novolak between an aromatic compound or an aromatic group-containing compound corresponding to the group A, and aromatic aldehyde corresponding to the group B. The chemical group (a), the chemical group (b), and the chemical group (c) are introduced in a starting material for the reaction to form novolak or introduced through a reaction in a polymer in which novolak has been formed.

Examples of an acid catalyst for use in the condensation reaction include mineral acids such as sulfuric acid, phosphoric acid, and perchloric acid, organic sulfonic acids such as methanesulfonic acid, p-toluenesulfonic acid, p-toluenesulfonic acid monohydrate, and carboxylic acids such as formic acid and oxalic acid. The amount of use of the acid catalyst is selected variously according to the type of the acid to be used. Usually, the amount of use of the acid catalyst is from 0.001 to 10000 parts by mass, preferably from 0.01 to 1000 parts by mass, and more preferably from 0.1 to 100 parts by mass based on 100 parts by mass of the compound corresponding to the group A of formula (1).

The condensation reaction is performed without a solvent but is usually performed using a solvent. Any solvent can be used as long as the solvent does not inhibit the reaction. Examples of the solvent include cyclic ethers such as tetrahydrofuran and dioxane, propylene glycol monomethyl ether, and propylene glycol monomethyl ether acetate. In addition, if the acid catalyst to be used is liquid, such as formic acid, the catalyst can also serve as a solvent.

The reaction temperature during condensation is usually from 40° C. to 200° C. The reaction time is selected variously according to the reaction temperature but is usually from about 30 minutes to about 50 hours.

The weight average molecular weight Mw of the polymer which is obtained in the manner as described above is usually from 600 to 1000000 or from 600 to 200000.

Examples of the unit structure of formula (1) are given below.

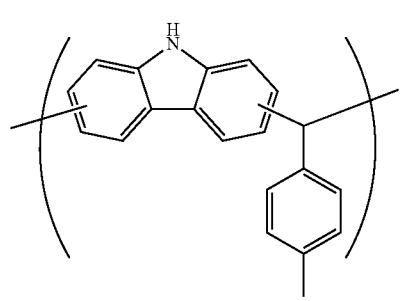

Formula (1-1)

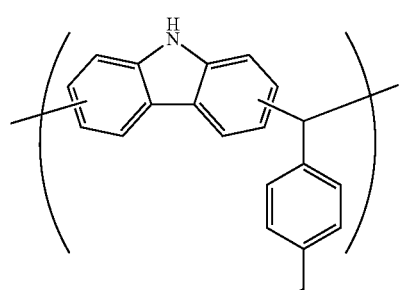

Formula (1-2)

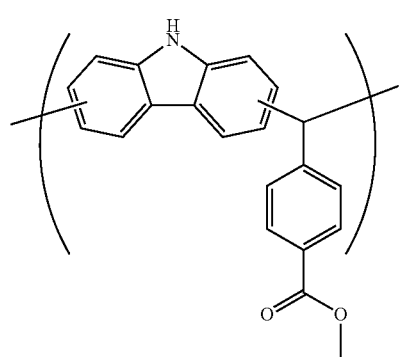

Formula (1-3)

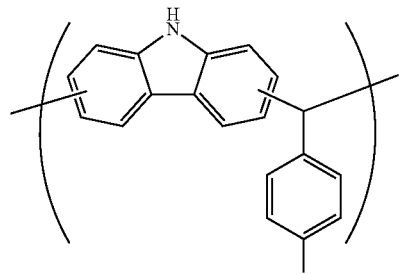

Formula (1-4)

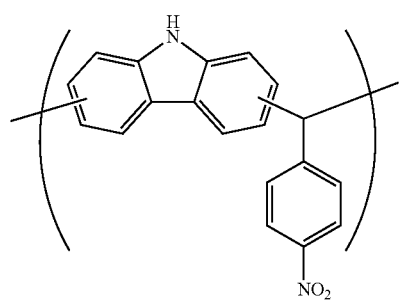

Formula (1-5)

-continued
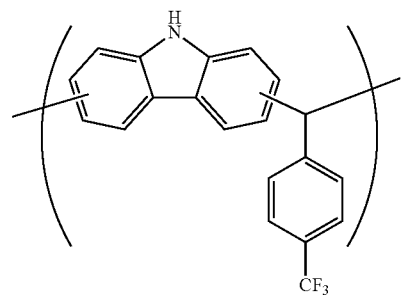
Formula (1-6)
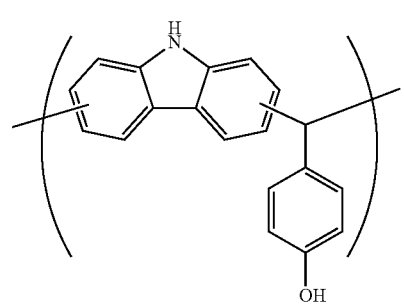
Formula (1-7)
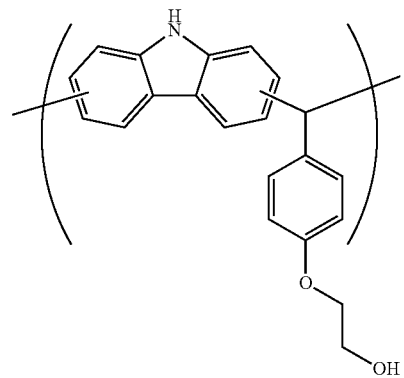
Formula (1-8)
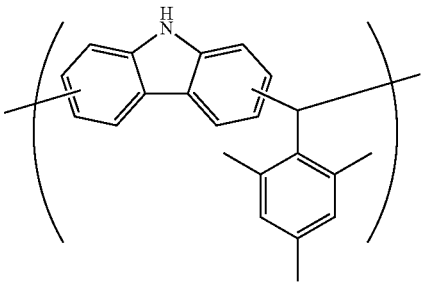
Formula (1-9)
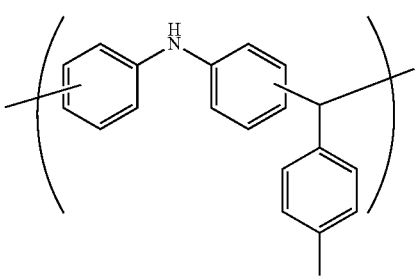
Formula (1-10)
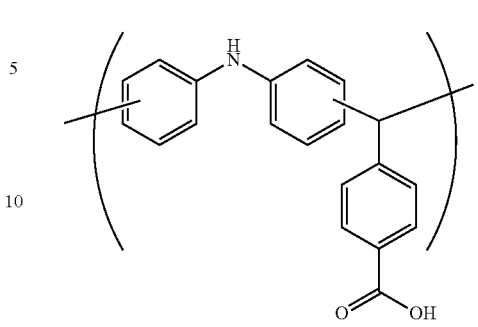
Formula (1-11)
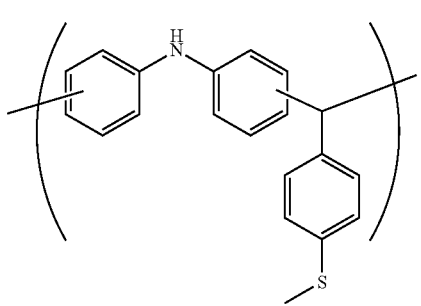
Formula (1-12)
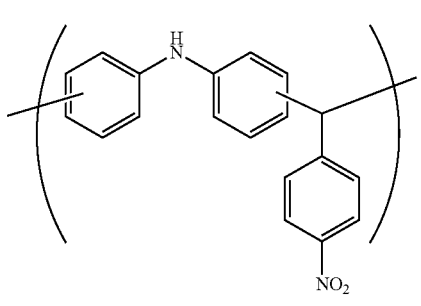
Formula (1-13)
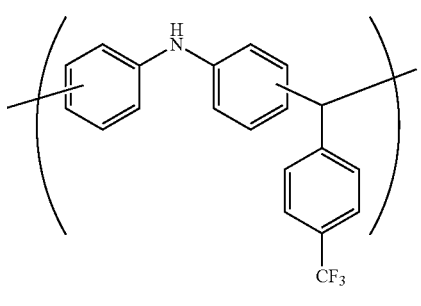
Formula (1-14)
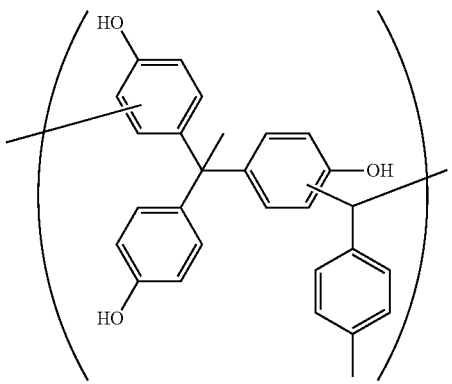
Formula (1-15)

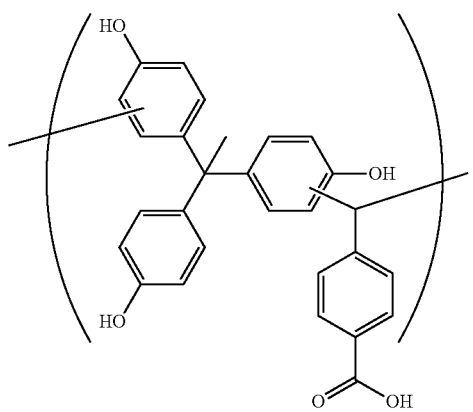

Formula (1-16)

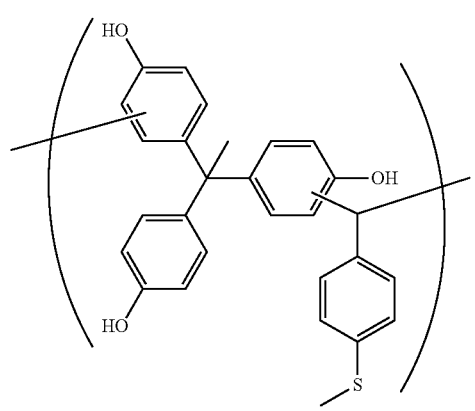

Formula (1-17)

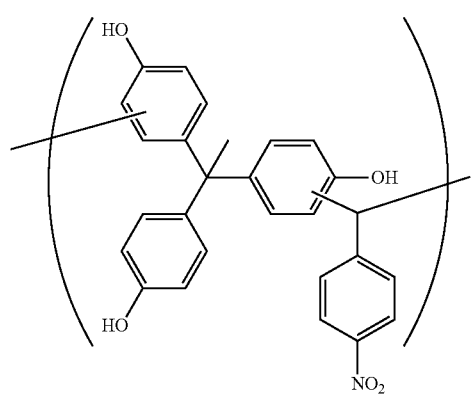

Formula (1-18)

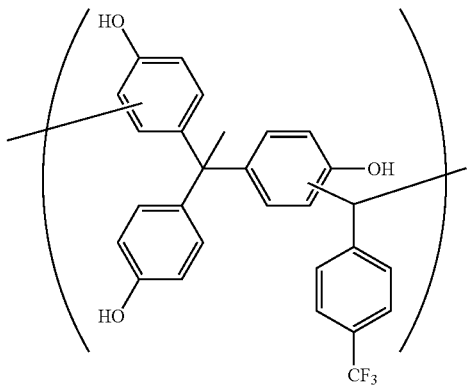

Formula (1-19)

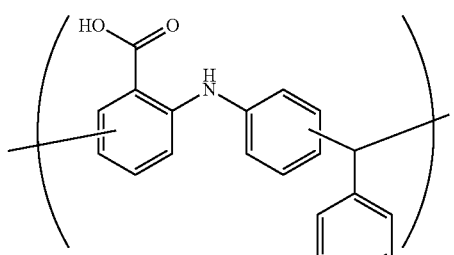

Formula (1-20)

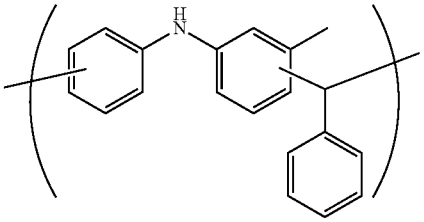

Formula (1-21)

The polymers can be each used by being mixed with 30% by mass or less of another polymer in the whole polymer.

Examples of the polymers include polyacrylic acid ester compounds, polymethacrylic acid ester compounds, polyacrylamide compounds, polymethacrylamide compounds, polyvinyl compounds, polystyrene compounds, polymaleimide compounds, polymaleic anhydrides, and polyacrylonitriles compounds.

The resist underlayer film-forming composition of the present invention comprises the polymer and a solvent. The resist underlayer film-forming composition of the present invention can comprise a crosslinker and an acid and, if necessary, can comprise an additive, such as an acid generator and a surfactant. The solid content of the composition is from 0.1 to 70% by mass, or from 0.1 to 60% by mass. The solid content refers to a proportion of the all the components contained, excluding the solvent from the resist underlayer film-forming composition. In the solid content, the polymer can be contained in a proportion of from 1 to 100% by mass, or from 1 to 99.9% by mass, or from 50 to 99.9% by mass.

The weight average molecular weight of the polymer for use in the present invention is from 600 to 1000000, or from 600 to 200000.

The resist underlayer film-forming composition of the present invention can comprise a crosslinker component. Examples of the crosslinker include melamine-based crosslinkers, substituted urea-based crosslinkers, or melamine or substituted urea polymer-based crosslinkers. The crosslinker is preferably a crosslinker having at least two crosslink-forming substituents, and is a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. In addition, condensates of these compounds can also be used.

In addition, a crosslinker having high heat resistance can be used as the crosslinker. As the crosslinker having high heat resistance, a compound which contains a crosslink-forming substituent having an aromatic ring (for example, benzene ring, naphthalene ring) within a molecule thereof can preferably be used.

Example of this compound include a compound having a partial structure of the following formula (3), and a polymer or an oligomer having a repeating unit of the following formula (4).

In formula (3), $R^3$ and $R^4$ are each a hydrogen atom, a $C_{1-10}$ alkyl group, or a $C_{6-20}$ aryl group, n1 is an integer of from 1 to 4, n2 is an integer of from 1 to (5−n1), and (n1+n2) is an integer of from 2 to 5.

In formula (4), $R^5$ is a hydrogen atom or a $C_{1-10}$ alkyl group, $R^6$ is a $C_{1-10}$ alkyl group, n3 is an integer of from 1 to 4, n4 is from 0 to (4−n3), and (n3+n4) is an integer of from 1 to 4. The oligomer and the polymer having a number of repeating units in a range of from 2 to 100 or from 2 to 50 can be used.

Examples of the $C_{1-10}$ alkyl group include the above-described examples. Examples of the $C_{6-20}$ aryl group include phenyl group, naphthyl group, and anthryl group.

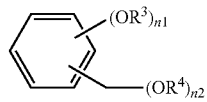

Formula (3)

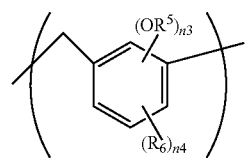

Formula (4)

Examples of the compounds, the polymers, and the oligomers of formula (4) and of formula (5) are given below.

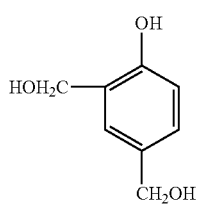

Formula (4-1)

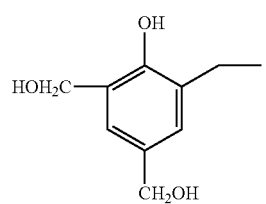

Formula (4-2)

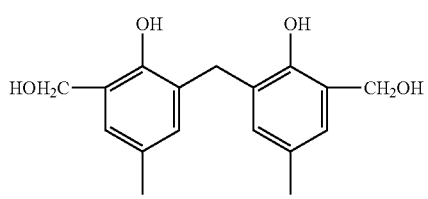

Formula (4-3)

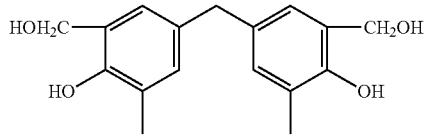

Formula (4-4)

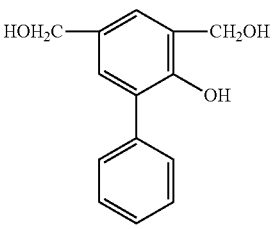

Formula (4-5)

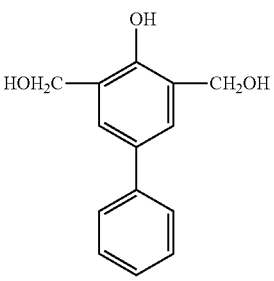

Formula (4-6)

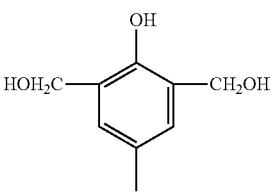

Formula (4-7)

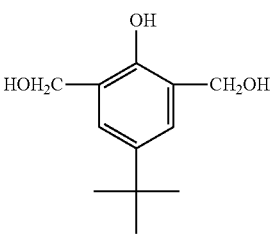

Formula (4-8)

Formula (4-9)
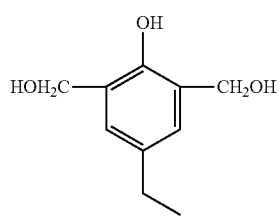
Formula (4-10)
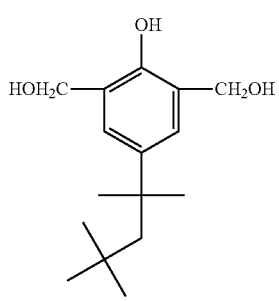
Formula (4-11)
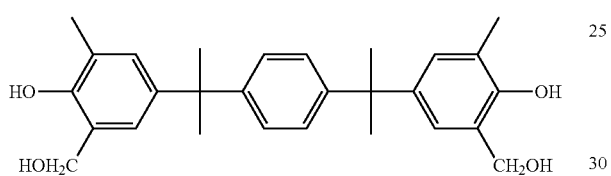
Formula (4-12)
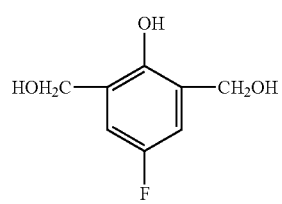
Formula (4-13)
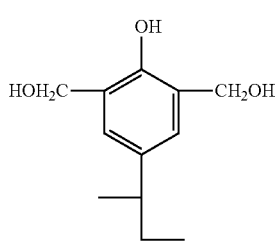
Formula (4-14)
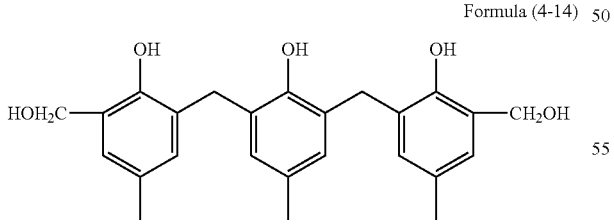
Formula (4-15)
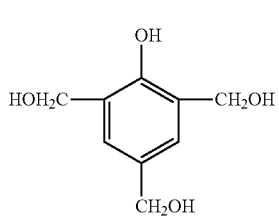
Formula (4-16)
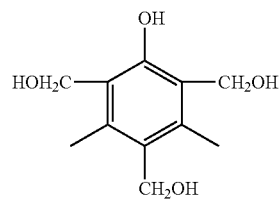
Formula (4-17)
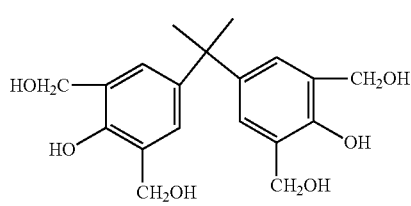
Formula (4-18)
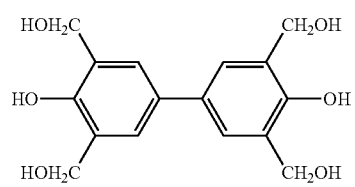
Formula (4-19)
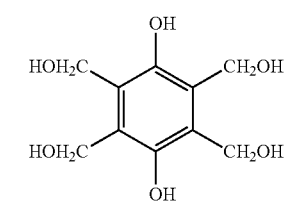
Formula (4-20)
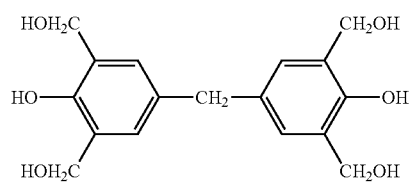
Formula (4-21)
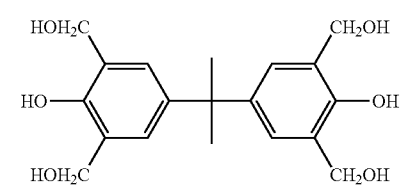
Formula (4-22)
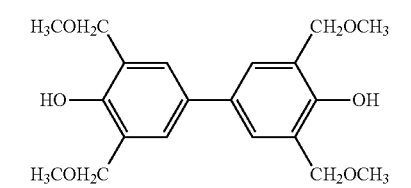
Formula (4-23)
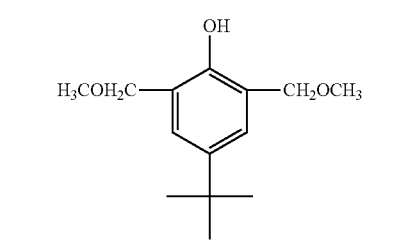

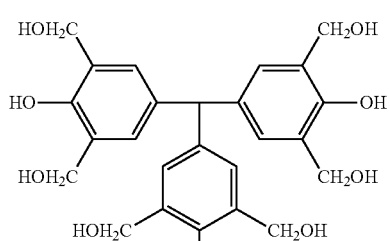

Formula (4-24)

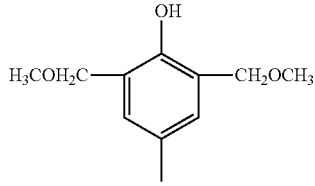

Formula (4-25)

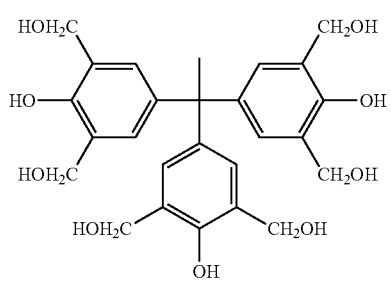

Formula (4-26)

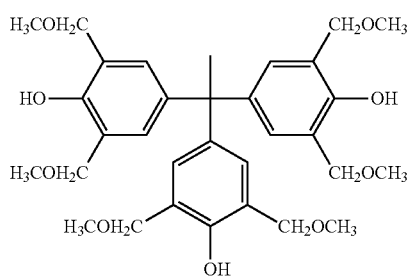

Formula (4-27)

The compounds are available as the products of Asahi Organic Chemicals Industry Co., Ltd. and of Honshu Chemical Industry Co., Ltd. For example, among the cross-linkers, the compound of formula (4-21) is available as TM-BIP-A, trade name, of Asahi Organic Chemicals Industry Co., Ltd.

The amount of the crosslinker to be added varies according to the solvent for application to be used, the base substrate to be used, the required solution viscosity, the required film shape, and the like but is from 0.001 to 80% by mass, preferably from 0.01 to 50% by mass, and still more preferably from 0.05 to 40% by mass based on the total solid content. These crosslinkers may cause crosslinking reaction due to self-condensation, but in the case where a crosslinkable substituent is present in the polymer of the present invention, the crosslinker can cause crosslinking reaction with the crosslinkable substituent.

In the present invention, as a catalyst for facilitating the crosslinking reaction, an acidic compound such as p-toluenesulfonic acid, trifluoromethanesulfonic acid, pyridinium p-toluenesulfonate, salicylic acid, sulfosalicylic acid, citric acid, benzoic acid, hydroxybenzoic acid, or naphthalene carboxylic acid or/and a thermal acid generator such as 2,4,4,6-tetrabromocyclohexanodienone, benzoin tosylate, 2-nitrobenzyltosylate, or an organic sulfonic acid alkyl ester can be blended. The amount to be blended is from 0.0001 to 20% by mass, preferably from 0.0005 to 10% by mass, and preferably from 0.01 to 3% by mass based on the total solid content.

To the application type underlayer film-forming composition for lithography of the present invention, a photoacid generator can be added in order to match the acidity with that of the photoresist with which the underlayer film is coated to form an upper layer in a lithography step. Examples of the preferable photoacid generator include onium salt-based photoacid generators such as bis(4-t-butylphenyl)iodonium trifluoromethanesulfonate, and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. The amount of the photoacid generator is from 0.2 to 10% by mass, preferably from 0.4 to 5% by mass based on the total solid content.

If necessary, to the resist underlayer film-forming composition for lithography of the present invention, an additional light absorber, a rheology modifier, an adhesive assistant, a surfactant, and the like can be added in addition to those described above.

As the additional light absorber, commercially available light absorbers described in "Kogyoyo Shikiso no Gijyutsu to Shijyo (Technology and Market of Industrial Colorants)" (CMC Publishing CO., LTD.) and "Senryo Binran (Handbook of Dyes)" (edited by The Society of Synthetic Organic Chemistry, Japan), such as, for example, C.I. Disperse Yellow 1, 3, 4, 5, 7, 8, 13, 23, 31, 49, 50, 51, 54, 60, 64, 66, 68, 79, 82, 88, 90, 93, 102, 114, and 124; C.I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C.I. Disperse Violet 43; C.I. Disperse Blue 96; C.I. Fluorescent Brightening Agent 112, 135, and 163; C.I. Solvent Orange 2 and 45; C.I. Solvent Red 1, 3, 8, 23, 24, 25, 27, and 49; C.I. Pigment Green 10; and C.I. Pigment Brown 2 can be suitably used. The light absorber is usually blended in a proportion of 10% by mass or less, preferably 5% by mass or less based on the total solid content of the resist underlayer film-forming composition for lithography.

The rheology modifier is added mainly for the purpose of improving the fluidity of the resist underlayer film-forming composition and, particularly in the baking step, improving the film thickness uniformity of the resist underlayer film and enhancing a packing property of the resist underlayer film-forming composition to the inside of a hole. Specific examples include phthalic acid derivatives such as dimethyl phthalate, diethyl phthalate, diisobutyl phthalate, dihexyl phthalate, and butyl isodecyl phthalate, adipic acid derivatives such as di-normal-butyl adipate, diisobutyl adipate, diisooctyl adipate, and octyl decyl adipate, maleic acid derivatives such as di-normal-butyl maleate, diethyl maleate, and dinonyl maleate, oleic acid derivatives such as methyl oleate, butyl oleate, and tetrahydrofurfuryl oleate, or stearic acid derivatives such as normal butyl stearate and glyceryl stearate. The rheology modifier is usually blended in a proportion of less than 30% by mass based on the total solid content of the resist underlayer film-forming composition for lithography.

The adhesive assistant is added mainly for the purpose of improving the adhesiveness between the substrate or the resist and the resist underlayer film-forming composition and, particularly in the development, preventing the resist from peeling. Specific examples include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobezothiazole, 2-mercaptobenzoxazole, urazole, thiouracil, mercaptoimidazole, and mercaptopyrimidine, and urea or thiourea compounds such as 1,1-dimethylurea and 1,3-dimethylurea. The adhesive assistant is blended in a proportion of usually less than 5% by mass, preferably less than 2% by mass based on the total solid content of the resist underlayer film-forming composition for lithography.

In the resist underlayer film-forming composition for lithography of the present invention, a surfactant can be blended for the purpose of preventing the occurrence of a pin hole and a striation and further improving the applicability against surface unevenness. Examples of the surfactant include: nonionic surfactants such as polyoxyethylene alkyl ethers including polyoxyethylene lauryl ether, polyoxyethylene stearyl ether, polyoxyethylene cetyl ether, and polyoxyethylene oleyl ether, polyoxyethylene alkylallyl ethers including polyoxyethylene octylphenol ether and polyoxyethylene nonylphenyl ether, polyoxyethylene-polyoxypropylene block copolymers, sorbitan fatty acid esters including sorbitan monolaurate, sorbitan monopalmitate, sorbitan monostearate, sorbitan monooleate, sorbitan trioleate, and sorbitan tristearate, and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as F-Top EF301, EF303, and EF352 (manufactured by Tohkem Products Corporation, trade name), MEGA FACE F171, F173, R-30, R-40, and R-40N (manufactured by DIC Corporation, trade name), Fluorad FC430 and FC431 (manufactured by Sumitomo 3M Limited, trade name), AsahiGuard AG710, Surflon S-382, SC101, SC102, SC103, SC104, SC105, and SC106 (manufactured by Asahi Glass Co., Ltd., trade name); and an organosiloxane polymer KP341 (manufactured by Shin-Etsu Chemical Co., Ltd.). The amount of the surfactant to be blended is usually 2.0% by mass or less, preferably 1.0% by mass or less based on the total solid content of the resist underlayer film-forming composition for lithography of the present invention. These surfactants may be added singly or in a combination of two or more.

In the present invention, as the solvent to dissolve the polymer, the crosslinker component, the crosslinking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and the like can be used. These solvents are used singly or in a combination of two or more.

Further, a high boiling point solvent, such as propylene glycol monobutyl ether and propylene glycol monobutyl ether acetate, can be mixed and used. Among these solvents, propylene glycol monomethyl ether, propylene glycol monomethyl ether acetate, ethyl lactate, butyl lactate, cyclohexanone, and the like are preferable for improving a leveling property.

Next, a method for forming a resist pattern of the present invention will be described. On a substrate (for example, transparent substrate such as silicon/silicon dioxide coating, glass substrate, or ITO substrate) for use in producing a precision integrated circuit device, a resist underlayer film-forming composition is applied by an appropriate application method such as a spinner or a coater, and the applied resist underlayer film-forming composition is then baked and cured to prepare an application type underlayer film. The film thickness of the resist underlayer film herein is preferably from 0.01 to 3.0 µm. In addition, the condition of baking after the application is at from 80 to 350° C. for from 0.5 to 120 minutes. After that, a resist is applied directly to the resist underlayer film, or if necessary, a resist is applied after one or more layers of coating material are formed on application type underlayer film. The resist is irradiated with light or an electron beam through a predetermined mask, developed, washed, and dried to obtain a good resist pattern. If necessary, post exposure bake (PEB) can be also carried out after the irradiation with light or an electron beam. Subsequently, a portion of the resist underlayer film at which the resist is removed through development by the step is removed through dry etching, and thus a desired pattern can be formed on the substrate.

The resist for use in the present invention refers to a photoresist or an electron beam resist.

As the photoresist to be applied on the upper portion of the resist underlayer film for lithography in the present invention, any of negative type and positive type photoresists can be used, there are a positive type photo resist comprising: a novolak resin; and 1,2-naphtoquinone diazide sulfonic acid ester, a chemical amplification type photoresist comprising: a binder having a group that is decomposed by an acid to increase a rate of dissolution in alkali; and a photoacid generator, a chemical amplification type photoresist comprising: an alkali-soluble binder; a low molecular weight compound that is decomposed by an acid to increase a rate of dissolution of the photoresist in alkali; and a photoacid generator, a chemical amplification type photoresist comprising: a binder having a group that is decomposed by an acid to increase a rate of dissolution in alkali; a low molecular weight compound that is decomposed by an acid to increase a rate of dissolution of the photoresist in alkali; and a photoacid generator, a photoresist having an Si atom in the skeleton thereof, and the like, and examples thereof include APEX-E, trade name, manufactured by Rohm and Haas Company.

In addition, examples of the electron beam resist to be applied on the upper portion of the resist underlayer film for lithography in the present invention include a composition comprising: a resin that contains an Si—Si bond in the main chain and contains an aromatic ring at an end; and a photoacid generator that generates an acid through irradiation with an electron beam, or a composition comprising: poly(p-hydroxystyrene) in which an N-carboxyamine-containing organic group is substituted for a hydroxy group; and a photoacid generator that generates an acid through irradiation with an electron beam. In the latter electron beam resist composition, an acid generated from the acid generator through irradiation with an electron beam reacts with N-carboxy aminooxy group in the polymer side chain to decompose the polymer side chain to produce a hydroxy group, so that the polymer exhibits alkali solubility to dissolve into an alkali developing fluid, and thus a resist pattern is formed. Examples of the acid generator that generates an acid through irradiation with an electron beam include halogenated organic compounds such as
1,1-bis[p-chlorophenyl]-2,2,2-trichloroethane,
1,1-bis[p-methoxyphenyl]-2,2,2-trichloroethane,
1,1-bis[p-chlorophenyl]-2,2-dichloroethane, and 2-chloro-6-(trichloromethyl)pyridine, onium salts such as triphenylsulfonium salts and diphenyl iodonium salt, and sulfonic acid esters such as nitrobenzyltosylate and dinitrobenzyltosylate.

After a resist solution is applied, baking is performed at a baking temperature of from 70 to 150° C. for a baking time of from 0.5 to 5 minutes, and the resist film thickness is obtained in a range of from 10 to 1000 nm. The resist solution, developing fluid, and the application material shown below can be applied by spin coating, a dipping method, and a spraying method, and the spin coating method is particularly preferable. The exposure of the resist is performed through a predetermined mask. KrF excimer laser (wavelength 248 nm), ArF excimer laser (wavelength 193 nm), and EUV light (wavelength 13.5 nm), an electron beam, and the like can be used for the exposure. If necessary, post exposure bake (PEB) can also be performed after the exposure. The heating temperature and the heating time of the PEB are appropriately selected from 70° C. to 150° C. and from 0.3 to 10 minutes.

As the developing fluid for a resist having a resist underlayer film formed using the resist underlayer film-forming composition for lithography of the present invention, an aqueous solution of alkali or the like, which includes inorganic alkali such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine, and the like, can be used. Further, to the aqueous solution of the alkali, an appropriate amount of an alcohol such as isopropyl alcohol or a surfactant such as a nonionic surfactant can be added and used. Among these, preferable developing fluids are quaternary ammonium salts, more preferably tetramethylammonium hydroxide and choline.

In addition, in the present invention, as a developing fluid, an organic solvent can be used for developing the resist. Development is performed with the developing fluid (solvent) after the exposure of the resist. Thus, in the case where a positive type photoresist is used for example, a portion of the photoresist which is not subjected to exposure is removed to form a photoresist pattern.

Examples of the developing fluid include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Further, to the developing fluid, a surfactant or the like can be added. As the condition of the development, the temperature and the time are appropriately selected from 5° C. to 50° C. and from 10 to 600 seconds.

In the present invention, a semiconductor device can be produced through: a step of forming the resist underlayer film from a resist underlayer film-forming composition on a semiconductor substrate; a step of forming a resist film on the resist underlayer film; a step of forming a resist pattern through irradiation with light or an electron beam and development; a step of etching the resist underlayer film with the formed resist pattern, and a step of processing the semiconductor substrate with the patterned resist underlayer film.

When formation of finer resist pattern further proceeds, a problem of resolution and a problem in which the resist pattern collapses after development occur. Therefore, a decrease in film thickness of the resist is desired. In this case, it is difficult to obtain a resist pattern film thickness sufficient for substrate processing. A process of imparting a function of a mask during substrate processing to not only the resist pattern but also the resist underlayer film that is formed between the resist and the semiconductor substrate to be processed is required. As a resist underlayer film for such a process, a resist underlayer film for lithography having a selection ratio of dry etching rate close to that of the resist, which is different from a conventional resist underlayer film having a high etching rate, a resist underlayer film for lithography having a smaller selection ratio of dry etching rate than that of the resist, and a resist underlayer film for lithography having a smaller selection ratio of dry etching rate than that of the semiconductor substrate are required. To such a resist underlayer film, an anti-reflective performance may be imparted, and the resist underlayer film may have a function of a conventional anti-reflective coating.

On the other hand, in order to obtain a finer resist pattern, a process of making the resist pattern and the resist underlayer film finer by dry etching of the resist underlayer film than the pattern width in resist development began to be also used. A resist underlayer film having a selection ratio of dry etching rate close to that of the resist, which is different from the conventional anti-reflective coating having a high etching rate, is required as the resist underlayer film for such a process. To such a resist underlayer film, an anti-reflective performance may be imparted, and the resist underlayer film may have the function of the conventional anti-reflective coating.

In the present invention, the resist underlayer film of the present invention is formed on the substrate, and the resist may be applied directly to the resist underlayer film, or if necessary, the resist may be applied after one or more layers of coating material are formed on the resist underlayer film. In this case, even when the resist is thinly applied to prevent pattern collapse due to a decrease in pattern width of the resist, the substrate can be processed by selection of appropriate etching gas.

That is, a semiconductor device can be produced through: a step of forming the resist underlayer film from a resist underlayer film-forming composition on a semiconductor substrate; a step of forming a hard mask with a coating material containing a silicon component and the like or a hard mask (for example, silicon oxide nitride) through vapor deposition on the resist underlayer film; a step of further forming a resist film on the hard mask; a step of forming a resist pattern through irradiation with light or an electron beam and development; a step of etching the hard mask with the formed resist pattern and a halogen-based gas; a step of etching the resist underlayer film with the patterned hard mask and an oxygen-based gas or a hydrogen-based gas; and a step of processing the semiconductor substrate with the patterned resist underlayer film and a halogen-based gas.

Considering the function as an anti-reflective coating, the resist underlayer film-forming composition for lithography of the present invention has an improved effect of preventing light reflection. That is, a light absorption moiety is incorporated in the skeleton so that there is no substance to diffuse into the photoresist during drying by heating, and in addition, the light absorption moiety has sufficiently large light absorption performance.

In the resist underlayer film-forming composition for lithography of the present invention, the thermal stability is high, so that contamination of the upper layer film due to a decomposed product produced during baking can be prevented, and in addition, the temperature margin in the baking step can be given sufficiently.

Further, the resist underlayer film-forming composition for lithography of the present invention can be used, depending on the process condition, as a film having a function of preventing light reflection and further having a function of preventing the interaction between a substrate and a photoresist or preventing adverse action, to a substrate, of a material for use in a photoresist or of a substance produced when a photoresist is exposed.

EXAMPLES

Synthesis Example 1

In a 100-mL two-necked flask, 9.00 g of carbazole (manufactured by Tokyo Chemical Industry Co., Ltd.), 6.47 g of p-tolualdehyde (manufactured by Tokyo Chemical Industry Co., Ltd.), 38.52 g of propylene glycol monomethyl ether acetate, and 1.04 g of methanesulfonic acid (manufactured by Tokyo Chemical Industry Co., Ltd.) were placed. The resultant mixture was then heated to 150° C. to be refluxed and stirred for about 1.5 hours. After the reaction was completed, the mixture was diluted with 18.73 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 12.2 g of a powder resin was obtained. The obtained polymer corresponds to formula (1-1). The weight average molecular weight Mw measured in terms of polystyrene by GPC was 82,700, and the degree of polydispersity Mw/Mn was 13.5.

Synthesis Example 2

In a 100-mL two-necked flask, 8.00 g of carbazole (manufactured by Tokyo Chemical Industry Co., Ltd.), 7.19 g of terephthalaldehydric acid (manufactured by Tokyo Chemical Industry Co., Ltd.), 18.79 g of propylene glycol monomethyl ether acetate, 18.79 g of propylene glycol monomethyl ether, and 0.92 g of methanesulfonic acid (manufactured by Tokyo Chemical Industry Co., Ltd.) were placed. The resultant mixture was then heated to 150° C. to be refluxed and stirred for about 3.5 hours. After the reaction was completed, the mixture was diluted with 22.25 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 13.7 g of a powder resin was obtained. The obtained polymer corresponds to formula (1-2). The weight average molecular weight Mw measured in terms of polystyrene by GPC was 24,800, and the degree of polydispersity Mw/Mn was 4.30.

Synthesis Example 3

In a 100-mL two-necked flask, 8.00 g of carbazole (manufactured by Tokyo Chemical Industry Co., Ltd.), 7.86 g of terephthalaldehydric acid methyl ester (manufactured by Tokyo Chemical Industry Co., Ltd.), 24.14 g of propylene glycol monomethyl ether acetate, and 0.23 g of methanesulfonic acid (manufactured by Tokyo Chemical Industry Co., Ltd.) were placed. The resultant mixture was then heated to 150° C. to be refluxed and stirred for about 2 hours. After the reaction was completed, the mixture was diluted with 39.08 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 13.3 g of a powder resin was obtained. The obtained polymer corresponds to formula (1-3). The weight average molecular weight Mw measured in terms of polystyrene by GPC was 4,600, and the degree of polydispersity Mw/Mn was 3.16.

Synthesis Example 4

In a 100-mL two-necked flask, 8.00 g of carbazole (manufactured by Tokyo Chemical Industry Co., Ltd.), 7.28 g of 4-methylthiobenzaldehyde (manufactured by Tokyo Chemical Industry Co., Ltd.), 36.20 g of propylene glycol monomethyl ether acetate, and 0.23 g of methanesulfonic acid (manufactured by Tokyo Chemical Industry Co., Ltd.) were placed. The resultant mixture was then heated to 150° C. to be refluxed and stirred for about 3.5 hours. After the reaction was completed, the mixture was diluted with 24.71 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 9.02 g of a powder resin was obtained. The obtained polymer corresponds to formula (1-4). The weight average molecular weight Mw measured in terms of polystyrene by GPC was 3,800, and the degree of polydispersity Mw/Mn was 2.58.

Synthesis Example 5

In a 100-mL two-necked flask, 8.00 g of carbazole (manufactured by Tokyo Chemical Industry Co., Ltd.), 7.24 g of 4-nitrobenzaldehyde (manufactured by Tokyo Chemical Industry Co., Ltd.), 36.09 g of propylene glycol monomethyl ether acetate, and 0.23 g of methanesulfonic acid (manufactured by Tokyo Chemical Industry Co., Ltd.) were placed. The resultant mixture was then heated to 150° C. to be refluxed and stirred for about 1.25 hours. After the reaction was completed, the mixture was diluted with 24.63 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 12.1 g of a powder resin was obtained. The obtained polymer corresponds to formula (1-5). The weight average molecular weight Mw measured in terms of polystyrene by GPC was 1,900, and the degree of polydispersity Mw/Mn was 1.43.

Synthesis Example 6

In a 100-mL two-necked flask, 8.00 g of carbazole (manufactured by Tokyo Chemical Industry Co., Ltd.), 8.34 g of 4-trifluoromethylbenzaldehyde (manufactured by Tokyo Chemical Industry Co., Ltd.), 40.27 g of propylene glycol monomethyl ether acetate, and 0.92 g of methanesulfonic acid (manufactured by Tokyo Chemical Industry Co., Ltd.) were placed. The resultant mixture was then heated to 150° C. to be refluxed and stirred for about 4 hours. After the reaction was completed, the mixture was diluted with 24.16 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 6.45 g of a powder resin was obtained. The obtained polymer corresponds to formula (1-6). The weight average molecular weight Mw measured in terms of polystyrene by GPC was 4,000, and the degree of polydispersity Mw/Mn was 2.05.

Synthesis Example 7

In a 100-mL two-necked flask, 8.00 g of carbazole (manufactured by Tokyo Chemical Industry Co., Ltd.), 5.85 g of 4-hydroxybenzaldehyde (manufactured by Tokyo Chemical Industry Co., Ltd.), 17.23 g of propylene glycol monomethyl ether acetate, 17.23 g of propylene glycol monomethyl ether, and 0.92 g of methanesulfonic acid (manufactured by Tokyo Chemical Industry Co., Ltd.) were placed. The resultant mixture was then heated to 150° C. to be refluxed and stirred for about 2.5 hours. After the reaction was completed, the mixture was diluted with 20.10 g of propylene glycol monomethyl ether acetate. This solution was dropped into a solution of methanol/water=50/50 (vol %/vol %) to perform reprecipitation. The obtained precipitate was subjected to suction filtration, and the residue was dried at 60° C. overnight under reduced pressure. Thus, 9.90 g of a powder resin was obtained. The obtained polymer corresponds to formula (1-7). The weight average molecular weight Mw measured in terms of polystyrene by GPC was 4,100, and the degree of polydispersity Mw/Mn was 3.01.

Synthesis Example 8

In a 100-mL two-necked flask, 8.00 g of carbazole (manufactured by Tokyo Chemical Industry Co., Ltd.), 8.95 g of 4-(2-hydroxyethoxy)benzaldehyde (manufactured by Tokyo Chemical Industry Co., Ltd.), 43.68 g of propylene glycol monomethyl ether acetate, and 0.78 g of methanesulfonic acid (manufactured by Tokyo Chemical Industry Co., Ltd.) were placed. The resultant mixture was then heated to 150° C. to be refluxed and stirred for about 2.5 hours. After the reaction was completed, the mixture was diluted with 27.32 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 10.8 g of a powder resin was obtained. The obtained polymer corresponds to formula (1-8). The weight average molecular weight Mw measured in terms of polystyrene by GPC was 3,400, and the degree of polydispersity Mw/Mn was 1.85.

Synthesis Example 9

In a 100-mL two-necked flask, 8.00 g of carbazole (manufactured by Tokyo Chemical Industry Co., Ltd.), 7.10 g of 2,4,6-trimethylbenzaldehyde (manufactured by Tokyo Chemical Industry Co., Ltd.), 37.37 g of propylene glycol monomethyl ether acetate, and 0.92 g of methanesulfonic acid (manufactured by Tokyo Chemical Industry Co., Ltd.) were placed. The resultant mixture was then heated to 150° C. to be refluxed and stirred for about 21.5 hours. After the reaction was completed, the mixture was diluted with 22.09 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 9.20 g of a powder resin was obtained. The obtained polymer corresponds to formula (1-9). The weight average molecular weight Mw measured in terms of polystyrene by GPC was 12,700, and the degree of polydispersity Mw/Mn was 3.82.

Synthesis Example 10

In a 100-mL two-necked flask, 7.04 g of diphenylamine (manufactured by Tokyo Chemical Industry Co., Ltd.), 5.00 g of p-tolualdehyde (manufactured by Tokyo Chemical Industry Co., Ltd.), 20.65 g of propylene glycol monomethyl ether acetate, 8.85 g of propylene glycol monomethyl ether, and 0.60 g of methanesulfonic acid (manufactured by Tokyo Chemical Industry Co., Ltd.) were placed. The resultant mixture was then heated to 150° C. to be refluxed and stirred for about 1.5 hours. After the reaction was completed, the mixture was diluted with 18.07 g of cyclohexanone. This solution was dropped into a methanol solution to perform reprecipitation. The obtained precipitate was subjected to suction filtration, and the residue was dried at 60° C. overnight under reduced pressure. Thus, 8.11 g of a powder resin was obtained. The obtained polymer corresponds to formula (1-10). The weight average molecular weight Mw measured in terms of polystyrene by GPC was 15,300, and the degree of polydispersity Mw/Mn was 3.52.

Synthesis Example 11

In a 100-mL two-necked flask, 9.02 g of diphenylamine (manufactured by Tokyo Chemical Industry Co., Ltd.), 8.00 g of terephthalaldehydric acid (manufactured by Tokyo Chemical Industry Co., Ltd.), 28.63 g of propylene glycol monomethyl ether acetate, 12.27 g of propylene glycol monomethyl ether, and 0.51 g of methanesulfonic acid (manufactured by Tokyo Chemical Industry Co., Ltd.) were placed. The resultant mixture was then heated to 150° C. to be refluxed and stirred for about 30 minutes. After the reaction was completed, the mixture was diluted with 26.66 g of cyclohexanone. This solution was dropped into a methanol solution to perform reprecipitation. The obtained precipitate was subjected to suction filtration, and the residue was dried at 60° C. overnight under reduced pressure. Thus, 10.6 g of a powder resin was obtained. The obtained polymer corresponds to formula (1-11). The weight average molecular weight Mw measured in terms of polystyrene by GPC was 82,200, and the degree of polydispersity Mw/Mn was 5.57.

Synthesis Example 12

In a 100-mL two-necked flask, 8.90 g of diphenylamine (manufactured by Tokyo Chemical Industry Co., Ltd.), 8.00 g of 4-methylthiobenzaldehyde (manufactured by Tokyo Chemical Industry Co., Ltd.), 28.43 g of propylene glycol monomethyl ether acetate, 12.28 g of propylene glycol monomethyl ether, and 0.51 g of methanesulfonic acid (manufactured by Tokyo Chemical Industry Co., Ltd.) were placed. The resultant mixture was then heated to 150° C. to be refluxed and stirred for about 1 hour. After the reaction was completed, the mixture was diluted with 26.48 g of cyclohexanone. This solution was dropped into a methanol solution to perform reprecipitation. The obtained precipitate was subjected to suction filtration, and the residue was dried at 60° C. overnight under reduced pressure. Thus, 10.7 g of a powder resin was obtained. The obtained polymer corresponds to formula (1-12). The weight average molecular weight Mw measured in terms of polystyrene by GPC was 6,300, and the degree of polydispersity Mw/Mn was 2.90.

Synthesis Example 13

In a 100-mL two-necked flask, 8.95 g of diphenylamine (manufactured by Tokyo Chemical Industry Co., Ltd.), 8.00 g of 4-nitrobenzaldehyde (manufactured by Tokyo Chemical Industry Co., Ltd.), 40.74 g of propylene glycol monomethyl ether acetate, and 0.51 g of methanesulfonic acid (manufactured by Tokyo Chemical Industry Co., Ltd.) were placed. The resultant mixture was then heated to 150° C. to be refluxed and stirred for about 15 minutes. After the reaction was completed, the mixture was diluted with 26.56 g of cyclohexanone. This solution was dropped into a methanol solution to perform reprecipitation. The obtained precipitate was subjected to suction filtration, and the residue was dried at 60° C. overnight under reduced pressure. Thus, 9.54 g of a powder resin was obtained. The obtained polymer corresponds to formula (1-13). The weight average molecular weight Mw measured in terms of polystyrene by GPC was 2,500, and the degree of polydispersity Mw/Mn was 1.95.

Synthesis Example 14

In a 100-mL two-necked flask, 6.80 g of diphenylamine (manufactured by Tokyo Chemical Industry Co., Ltd.), 7.00 g of 4-trifluoromethylbenzaldehyde (manufactured by Tokyo Chemical Industry Co., Ltd.), 23.49 g of propylene glycol monomethyl ether acetate, 10.07 g of propylene glycol monomethyl ether, and 0.58 g of methanesulfonic acid (manufactured by Tokyo Chemical Industry Co., Ltd.) were placed. The resultant mixture was then heated to 150° C. to be refluxed and stirred for about 1.5 hours. After the reaction was completed, the mixture was diluted with 21.07 g of cyclohexanone. This solution was dropped into a methanol solution to perform reprecipitation. The obtained precipitate was subjected to suction filtration, and the residue was dried at 60° C. overnight under reduced pressure. Thus, 4.76 g of a powder resin was obtained. The obtained polymer corresponds to formula (1-14). The weight average molecular weight Mw measured in terms of polystyrene by GPC was 103,000, and the degree of polydispersity Mw/Mn was 2.32.

Synthesis Example 15

In a 100-mL two-necked flask, 12.00 g of 1,1,1-tris(4-hydroxyphenyl)ethane (manufactured by Tokyo Chemical Industry Co., Ltd.), 4.71 g of p-tolualdehyde (manufactured by Tokyo Chemical Industry Co., Ltd.), 20.81 g of propylene glycol monomethyl ether acetate, 20.81 g of propylene glycol monomethyl ether, and 1.13 g of methanesulfonic acid (manufactured by Tokyo Chemical Industry Co., Ltd.) were placed. The resultant mixture was then heated to 150° C. to be refluxed and stirred for about 24 hours. After the reaction was completed, the mixture was diluted with 24.08 g of propylene glycol monomethyl ether acetate. This solution was dropped into methanol/water=60/40 (vol %/vol %) to perform reprecipitation. The obtained precipitate was subjected to suction filtration, and the residue was dried at 60° C. overnight under reduced pressure. Thus, 7.03 g of a powder resin was obtained. The obtained polymer corresponds to formula (1-15). The weight average molecular weight Mw measured in terms of polystyrene by GPC was 2,100, and the degree of polydispersity Mw/Mn was 1.61.

Synthesis Example 16

In a 100-mL two-necked flask, 10.20 g of 1,1,1-tris(4-hydroxyphenyl)ethane (manufactured by Tokyo Chemical Industry Co., Ltd.), 5.00 g of terephthalaldehydric acid (manufactured by Tokyo Chemical Industry Co., Ltd.), 18.30 g of propylene glycol monomethyl ether acetate, 18.30 g of propylene glycol monomethyl ether, and 0.48 g of methanesulfonic acid (manufactured by Tokyo Chemical Industry Co., Ltd.) were placed. The resultant mixture was then heated to 150° C. to be refluxed and stirred for about 24 hours. After the reaction was completed, the mixture was diluted with 23.74 g of propylene glycol monomethyl ether acetate. This solution was dropped into methanol/water=50/50 (vol %/vol %) to perform reprecipitation. The obtained precipitate was subjected to suction filtration, and the residue was dried at 60° C. overnight under reduced pressure. Thus, 7.84 g of a powder resin was obtained. The obtained polymer corresponds to formula (1-16). The weight average molecular weight Mw measured in terms of polystyrene by GPC was 4,000, and the degree of polydispersity Mw/Mn was 2.17.

Synthesis Example 17

In a 100-mL two-necked flask, 12.00 g of 1,1,1-tris(4-hydroxyphenyl)ethane (manufactured by Tokyo Chemical Industry Co., Ltd.), 5.96 g of 4-methylthiobenzaldehyde (manufactured by Tokyo Chemical Industry Co., Ltd.), 29.95 g of propylene glycol monomethyl ether acetate, 12.83 g of propylene glycol monomethyl ether, and 0.38 g of methanesulfonic acid (manufactured by Tokyo Chemical Industry Co., Ltd.) were placed. The resultant mixture was then heated to 150° C. to be refluxed and stirred for about 44 hours. After the reaction was completed, the mixture was diluted with 28.67 g of propylene glycol monomethyl ether acetate. This solution was dropped into methanol/water=50/50 (vol %/vol %) to perform reprecipitation. The obtained precipitate was subjected to suction filtration, and the residue was dried at 60° C. overnight under reduced pressure. Thus, 11.9 g of a powder resin was obtained. The obtained polymer corresponds to formula (1-17). The weight average molecular weight Mw measured in terms of polystyrene by GPC was 2,000, and the degree of polydispersity Mw/Mn was 1.73.

Synthesis Example 18

In a 100-mL two-necked flask, 10.14 g of 1,1,1-tris(4-hydroxyphenyl)ethane (manufactured by Tokyo Chemical Industry Co., Ltd.), 5.00 g of 4-nitrobenzaldehyde (manufactured by Tokyo Chemical Industry Co., Ltd.), 18.22 g of propylene glycol monomethyl ether acetate, 18.22 g of propylene glycol monomethyl ether, and 0.48 g of methanesulfonic acid (manufactured by Tokyo Chemical Industry Co., Ltd.) were placed. The resultant mixture was then heated to 150° C. to be refluxed and stirred for about 24 hours. After the reaction was completed, the mixture was diluted with 23.64 g of propylene glycol monomethyl ether acetate. This solution was dropped into methanol/water=50/50 (vol %/vol %) to perform reprecipitation. The obtained precipitate was subjected to suction filtration, and the residue was dried at 60° C. overnight under reduced pressure. Thus, 11.6 g of a powder resin was obtained. The obtained polymer corresponds to formula (1-18). The weight average molecular weight Mw measured in terms of polystyrene by GPC was 4,300, and the degree of polydispersity Mw/Mn was 2.14.

Synthesis Example 19

In a 100-mL two-necked flask, 12.00 g of 1,1,1-tris(4-hydroxyphenyl)ethane (manufactured by Tokyo Chemical Industry Co., Ltd.), 6.82 g of 4-trifluoromethylbenzaldehyde (manufactured by Tokyo Chemical Industry Co., Ltd.), 23.27 g of propylene glycol monomethyl ether acetate, 23.27 g of propylene glycol monomethyl ether, and 1.13 g of methanesulfonic acid (manufactured by Tokyo Chemical Industry Co., Ltd.) were placed. The resultant mixture was then heated to 150° C. to be refluxed and stirred for about 5 hours. After the reaction was completed, the mixture was diluted with 27.60 g of propylene glycol monomethyl ether acetate. This solution was dropped into methanol/water=50/50 (vol %/vol %) to perform reprecipitation. The obtained precipitate was subjected to suction filtration, and the residue was dried at 60° C. overnight under reduced pressure. Thus, 11.1 g of a powder resin was obtained. The obtained polymer corresponds to formula (1-19). The weight average molecular weight Mw measured in terms of polystyrene by GPC was 4,000, and the degree of polydispersity Mw/Mn was 1.53.

Synthesis Example 20

In a 100-mL two-necked flask, 10.05 g of N-phenylanthranilic acid (manufactured by Tokyo Chemical Industry Co., Ltd.), 5.00 g of benzaldehyde (manufactured by Tokyo Chemical Industry Co., Ltd.), 18.35 g of propylene glycol monomethyl ether acetate, 18.35 g of propylene glycol monomethyl ether, and 0.68 g of methanesulfonic acid (manufactured by Tokyo Chemical Industry Co., Ltd.) were placed. The resultant mixture was then heated to 150° C. to be refluxed and stirred for about 2 hours. After the reaction was completed, the mixture was diluted with 22.81 g of cyclohexanone. This solution was dropped into a methanol solution to perform reprecipitation. The obtained precipitate was subjected to suction filtration, and the residue was dried at 60° C. overnight under reduced pressure. Thus, 7.81 g of a powder resin was obtained. The obtained polymer corresponds to formula (1-20). The weight average molecular weight Mw measured in terms of polystyrene by GPC was 6,300, and the degree of polydispersity Mw/Mn was 1.78.

Synthesis Example 21

In a 100-mL two-necked flask, 9.50 g of 3-methyldiphenylamine (manufactured by Tokyo Chemical Industry Co., Ltd.), 5.50 g of benzaldehyde (manufactured by Tokyo Chemical Industry Co., Ltd.), 18.37 g of propylene glycol monomethyl ether acetate, 18.37 g of propylene glycol monomethyl ether, and 0.75 g of methanesulfonic acid (manufactured by Tokyo Chemical Industry Co., Ltd.) were placed. The resultant mixture was then heated to 150° C. to be refluxed and stirred for about 45 minutes. After the reaction was completed, the mixture was diluted with 22.51 g of cyclohexanone. This solution was dropped into a methanol solution to perform reprecipitation. The obtained precipitate was subjected to suction filtration, and the residue was dried at 60° C. overnight under reduced pressure. Thus, 11.5 g of a powder resin was obtained. The obtained polymer corresponds to formula (1-21). The weight average molecular weight Mw measured in terms of polystyrene by GPC was 52,700, and the degree of polydispersity Mw/Mn was 8.86.

Comparative Synthesis Example 1

In a 100-mL two-necked flask, 8.00 g of carbazole (manufactured by Tokyo Chemical Industry Co., Ltd.), 5.08 g of benzaldehyde (manufactured by Tokyo Chemical Industry Co., Ltd.), 32.36 g of propylene glycol monomethyl ether acetate, and 0.92 g of methanesulfonic acid (manufactured by Tokyo Chemical Industry Co., Ltd.) were placed. The resultant mixture was then heated to 150° C. to be refluxed and stirred for about 1.5 hours. After the reaction was completed, the mixture was diluted with 23.43 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 8.92 g of a powder resin was obtained. The obtained polymer corresponds to formula (2-1). The weight average molecular weight Mw measured in terms of polystyrene by GPC was 32,200, and the degree of polydispersity Mw/Mn was 2.14.

Formula (2-1)

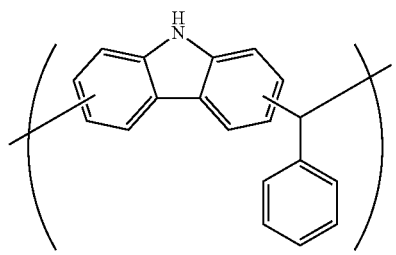

Comparative Synthesis Example 2

In a 100-mL two-necked flask, 8.77 g of diphenylamine (manufactured by Tokyo Chemical Industry Co., Ltd.), 5.50 g of benzaldehyde (manufactured by Tokyo Chemical Industry Co., Ltd.), 24.53 g of propylene glycol monomethyl ether acetate, 10.51 g of propylene glycol monomethyl ether, and 0.75 g of methanesulfonic acid (manufactured by Tokyo Chemical Industry Co., Ltd.) were placed. The resultant mixture was then heated to 150° C. to be refluxed and stirred for about 15 minutes. After the reaction was completed, the mixture was diluted with 92.65 g of cyclohexanone. This solution was dropped into a methanol solution to perform reprecipitation. The obtained precipitate was subjected to suction filtration, and the residue was dried at 60° C. overnight under reduced pressure. Thus, 8.58 g of a powder resin was obtained. The obtained polymer corresponds to formula (2-2). The weight average molecular weight Mw measured in terms of polystyrene by GPC was 8,400, and the degree of polydispersity Mw/Mn was 2.38.

Formula (2-2)

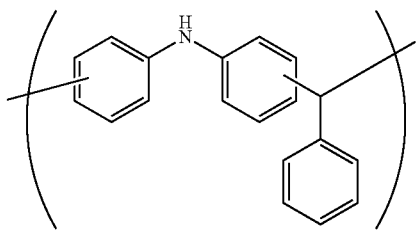

Comparative Synthesis Example 3

In a 100-mL two-necked flask, 12.00 g of 1,1,1-tris(4-hydroxyphenyl)ethane (manufactured by Tokyo Chemical Industry Co., Ltd.), 4.16 g of benzaldehyde (manufactured by Tokyo Chemical Industry Co., Ltd.), 19.51 g of propylene glycol monomethyl ether acetate, 19.51 g of propylene glycol monomethyl ether, and 0.56 g of methanesulfonic acid (manufactured by Tokyo Chemical Industry Co., Ltd.) were placed. The resultant mixture was then heated to 150° C. to be refluxed and stirred for about 19 hours. After the reaction was completed, the mixture was diluted with 24.08 g of propylene glycol monomethyl ether acetate. This solution was dropped into a solution of methanol/water=50/50 (vol %/vol %) to perform reprecipitation. The obtained precipitate was subjected to suction filtration, and the residue was dried at 60° C. overnight under reduced pressure. Thus, 11.0 g of a powder resin was obtained. The obtained polymer corresponds to formula (2-3). The weight average molecular weight Mw measured in terms of polystyrene by GPC was 4,600, and the degree of polydispersity Mw/Mn was 1.64.

Formula (2-3)

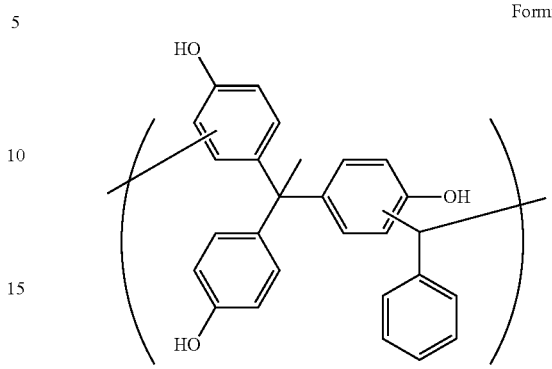

Comparative Synthesis Example 4

In a 100-mL two-necked flask, 8.00 g of carbazole (manufactured by Tokyo Chemical Industry Co., Ltd.), 7.77 g of 4-tert-butylbezaldehyde (manufactured by Tokyo Chemical Industry Co., Ltd.), 38.94 g of propylene glycol monomethyl ether acetate, and 0.92 g of methanesulfonic acid (manufactured by Tokyo Chemical Industry Co., Ltd.) were placed. The resultant mixture was then heated to 150° C. to be refluxed and stirred for about 1.5 hours. After the reaction was completed, the mixture was diluted with 23.21 g of propylene glycol monomethyl ether acetate. This solution was dropped into a methanol solution to perform reprecipitation. The obtained precipitate was subjected to suction filtration, and the residue was dried at 60° C. overnight under reduced pressure. Thus, 13.3 g of a powder resin was obtained. The obtained polymer corresponds to formula (2-4). The weight average molecular weight Mw measured in terms of polystyrene by GPC was 25,800, and the degree of polydispersity Mw/Mn was 4.44.

Formula (2-4)

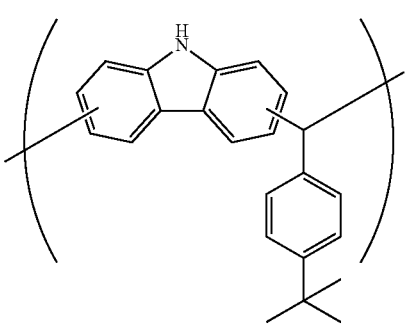

Comparative Synthesis Example 5

In a 100-mL two-necked flask, 8.34 g of diphenylamine (manufactured by Tokyo Chemical Industry Co., Ltd.), 8.34 g of 4-tert-butylbenzaldehyde (manufactured by Tokyo Chemical Industry Co., Ltd.), 39.24 g of propylene glycol monomethyl ether acetate, and 0.47 g of methanesulfonic acid (manufactured by Tokyo Chemical Industry Co., Ltd.) were placed. The resultant mixture was then heated to 150° C. to be refluxed and stirred for about 3 hours. After the reaction was completed, the mixture was diluted with 25.66 g of propylene glycol monomethyl ether acetate. This solution was dropped into a methanol solution to perform repecipitation. The obtained precipitate was subjected to suction filtration, and the residue was dried at 60° C. overnight under reduced pressure. Thus, 9.65 g of a powder resin was obtained. The obtained polymer corresponds to formula (2-5). The weight average molecular weight Mw measured in terms of polystyrene by GPC was 6,300, and the degree of polydispersity Mw/Mn was 2.03.

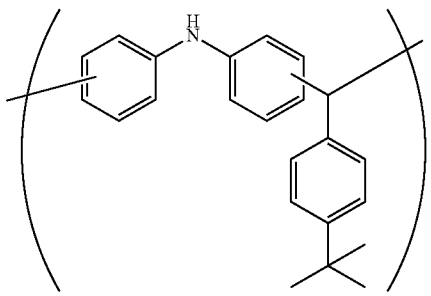

Formula (2-5)

Comparative Synthesis Example 6

In a 100-mL two-necked flask, 10.39 g of 1,1,1-tris(4-hydroxyphenyl)ethane (manufactured by Tokyo Chemical Industry Co., Ltd.), 5.50 g of 4-tert-butylbenzaldehyde (manufactured by Tokyo Chemical Industry Co., Ltd.), 19.10 g of propylene glycol monomethyl ether acetate, 19.10 g of propylene glycol monomethyl ether, and 0.49 g of methanesulfonic acid (manufactured by Tokyo Chemical Industry Co., Ltd.) were placed. The resultant mixture was then heated to 150° C. to be refluxed and stirred for about 24 hours. After the reaction was completed, the mixture was diluted with 24.85 g of propylene glycol monomethyl ether acetate. This solution was dropped into a solution of methanol/water=50/50 (vol %/vol %) to perform repecipitation. The obtained precipitate was subjected to suction filtration, and the residue was dried at 60° C. overnight under reduced pressure. Thus, 10.3 g of a powder resin was obtained. The obtained polymer corresponds to formula (2-6). The weight average molecular weight Mw measured in terms of polystyrene by GPC was 2,000, and the degree of polydispersity Mw/Mn was 1.97.

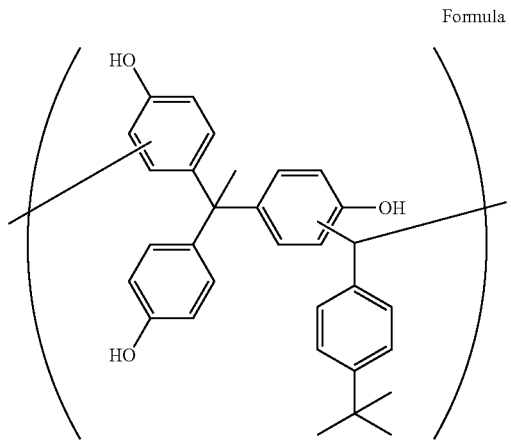

Formula (2-6)

Each resin of Synthesis Examples and Comparative Synthesis Examples was dissolved in a solvent, a cation exchange resin (product name: DOWEX® 550A, MUROMACHI TECHNOS CO., LTD.) and an anion exchange resin (product name: Amberlite® 15JWET, Organo Corporation) were then added thereto to perform ion exchange treatment at room temperature for 4 hours, and after the ion exchange resins were separated, a purified resin was obtained.

Example 1

With 1.0 g of the resin obtained in Synthesis Example 1, 0.001 g of MEGAFACE R-40 was mixed as a surfactant, the resultant mixture was dissolved in 5.66 g of propylene glycol monomethyl ether acetate and 2.42 g of propylene glycol monomethyl ether, and the resultant solution was filtrated using a polytetrafluoroethylene microfilter having a pore size of 0.02 μm to prepare a solution of a resist underlayer film-forming composition for use in a lithography process with a multilayered film.

Hereinafter, Examples 2 to 21 and Comparative Examples 1 to 6 were carried out in the same manner. It is to be noted that the amount of each polymer blended and of each surfactant blended and of each solvent blended were as shown in Tables 1 to 3 below.

In Tables, each polymer used is indicated by the Synthesis Example number, surfactant a represents name of article: MEGA FACE [trade name] R-40, manufactured by DIC Corporation, fluorine-based surfactant, solvent b represents propylene glycol monomethyl ether acetate, solvent c represents propylene glycol monomethyl ether, solvent d represents cyclohexanone, and the lower lines thereof denote the contents g thereof.

TABLE 1

|  | Polymer | Surfactant | Solvents | |
|---|---|---|---|---|
| Example 1 | Synthesis Example 1 | a | b | c |
|  | 1.0 g | 0.001 g | 5.66 g | 2.42 g |
| Example 2 | Synthesis Example 2 | a | b | c |
|  | 1.0 g | 0.001 g | 5.66 g | 2.42 g |
| Example 3 | Synthesis Example 3 | a | b | c |
|  | 1.0 g | 0.001 g | 2.70 g | 6.30 g |
| Example 4 | Synthesis Example 4 | a | b | c |
|  | 1.0 g | 0.001 g | 5.66 g | 2.42 g |
| Example 5 | Synthesis Example 5 | a | b | c |
|  | 1.0 g | 0.001 g | 5.66 g | 2.42 g |
| Example 6 | Synthesis Example 6 | a | b | d |
|  | 1.0 g | 0.001 g | 3.02 g | 7.07 g |
| Example 7 | Synthesis Example 7 | a | b | c |
|  | 1.0 g | 0.001 g | 5.66 g | 2.42 g |
| Example 8 | Synthesis Example 8 | a | b | c |
|  | 1.0 g | 0.001 g | 5.66 g | 2.42 g |
| Example 9 | Synthesis Example 9 | a | b | c |
|  | 1.0 g | 0.001 g | 5.66 g | 2.42 g |
| Example 10 | Synthesis Example 10 | a | b | d |
|  | 1.0 g | 0.001 g | 1.0 g | 9.01 g |

TABLE 2

|  | Polymer | Surfactant | Solvents | |
|---|---|---|---|---|
| Example 11 | Synthesis Example 11 | a | b | d |
|  | 1.0 g | 0.001 g | 1.0 g | 9.01 g |
| Example 12 | Synthesis Example 12 | a | b | d |
|  | 1.0 g | 0.001 g | 1.0 g | 9.01 g |
| Example 13 | Synthesis Example 13 | a | b | d |
|  | 1.0 g | 0.001 g | 1.0 g | 9.01 g |
| Example 14 | Synthesis Example 14 | a | b | d |
|  | 1.0 g | 0.001 g | 1.0 g | 9.01 g |

TABLE 2-continued

|  | Polymer | Surfactant | Solvents | |
|---|---|---|---|---|
| Example 15 | Synthesis Example 15 | a | b | c |
|  | 1.0 g | 0.001 g | 5.66 g | 2.42 g |
| Example 16 | Synthesis Example 16 | a | b | c |
|  | 1.0 g | 0.001 g | 2.70 g | 6.30 g |
| Example 17 | Synthesis Example 17 | a | b | c |
|  | 1.0 g | 0.001 g | 5.66 g | 2.42 g |
| Example 18 | Synthesis Example 18 | a | b | c |
|  | 1.0 g | 0.001 g | 2.70 g | 6.30 g |
| Example 19 | Synthesis Example 19 | a | b | c |
|  | 1.0 g | 0.001 g | 5.66 g | 2.42 g |
| Example 20 | Synthesis Example 20 | a | b | d |
|  | 1.0 g | 0.001 g | 1.0 g | 9.01 g |
| Example 21 | Synthesis Example 21 | a | b | d |
|  | 1.0 g | 0.001 g | 1.0 g | 9.01 g |

TABLE 3

|  | Polymer | Surfactant | Solvents | |
|---|---|---|---|---|
| Comparative Example 1 | Comparative Synthesis Example 1 | a | b | c |
|  | 1.0 g | 0.001 g | 5.66 g | 2.42 g |
| Comparative Example 2 | Comparative Synthesis Example 2 | a | b | d |
|  | 1.0 g | 0.001 g | 1.0 g | 9.01 g |
| Comparative Example 3 | Comparative Synthesis Example 3 | a | b | c |
|  | 1.0 g | 0.001 g | 5.66 g | 2.42 g |
| Comparative Example 4 | Comparative Synthesis Example 4 | a | b | c |
|  | 1.0 g | 0.001 g | 5.66 g | 2.42 g |
| Comparative Example 5 | Comparative Synthesis Example 5 | a | b | d |
|  | 1.0 g | 0.001 g | 1.0 g | 9.01 g |
| Comparative Example 6 | Comparative Synthesis Example 6 | a | b | c |
|  | 1.0 g | 0.001 g | 2.70 g | 6.30 g |

(Test of Elution to Resist Solvent)

Respective solutions of the resist underlayer film-forming compositions prepared in Examples 1 to 21 and Comparative Examples 1 to 6 were applied on a silicon wafer using a spin coater, and the applied solutions were baked on a hot plate at 400° C. for 90 seconds to form resist underlayer films (film thickness of 0.20 μm). These resist underlayer films were each immersed in ethyl lactate, propylene glycol monomethyl ether, propylene glycol monomethyl ether acetate, and cyclohexanone, which are solvents to be used for a resist. It was found that these resist underlayer films do not dissolve in these solvents.

(Measurement of Film Density)

Respective solutions of the resist underlayer film-forming compositions prepared in Examples 1 to 21 and Comparative Examples 1 to 6 were applied on a silicon wafer using a spin coater, and the applied solutions were baked on a hot plate at 400° C. for 90 seconds to form resist underlayer films (film thickness of 0.20 μm). To determine the density for these resist underlayer films, evaluation was conducted using an X-ray reflectance measurement apparatus (manufactured by Bruker Corporation). The results are shown in Tables below.

TABLE 4

| Example 1 | Film baked at 400° C. | 1.29 g/cm$^3$ |
|---|---|---|
| Example 2 | Film baked at 400° C. | 1.29 g/cm$^3$ |
| Example 3 | Film baked at 400° C. | 1.30 g/cm$^3$ |
| Example 4 | Film baked at 400° C. | 1.32 g/cm$^3$ |

TABLE 4-continued

| Example 5 | Film baked at 400° C. | 1.30 g/cm$^3$ |
|---|---|---|
| Example 6 | Film baked at 400° C. | 1.31 g/cm$^3$ |
| Example 7 | Film baked at 400° C. | 1.28 g/cm$^3$ |
| Example 8 | Film baked at 400° C. | 1.29 g/cm$^3$ |
| Example 9 | Film baked at 400° C. | 1.31 g/cm$^3$ |
| Example 10 | Film baked at 400° C. | 1.22 g/cm$^3$ |
| Example 11 | Film baked at 400° C. | 1.17 g/cm$^3$ |
| Example 12 | Film baked at 400° C. | 1.19 g/cm$^3$ |
| Example 13 | Film baked at 400° C. | 1.19 g/cm$^3$ |
| Example 14 | Film baked at 400° C. | 1.29 g/cm$^3$ |

TABLE 5

| Example 15 | Film baked at 400° C. | 1.27 g/cm$^3$ |
|---|---|---|
| Example 16 | Film baked at 400° C. | 1.24 g/cm$^3$ |
| Example 17 | Film baked at 400° C. | 1.21 g/cm$^3$ |
| Example 18 | Film baked at 400° C. | 1.21 g/cm$^3$ |
| Example 19 | Film baked at 400° C. | 1.21 g/cm$^3$ |
| Example 20 | Film baked at 400° C. | 1.19 g/cm$^3$ |
| Example 21 | Film baked at 400° C. | 1.19 g/cm$^3$ |
| Comparative Example 1 | Film baked at 400° C. | 1.27 g/cm$^3$ |
| Comparative Example 2 | Film baked at 400° C. | 1.16 g/cm$^3$ |
| Comparative Example 3 | Film baked at 400° C. | 1.17 g/cm$^3$ |
| Comparative Example 4 | Film baked at 400° C. | 1.21 g/cm$^3$ |
| Comparative Example 5 | Film baked at 400° C. | 1.10 g/cm$^3$ |
| Comparative Example 6 | Film baked at 400° C. | 1.17 g/cm$^3$ |

(Measurement of Hardness and Young's Modulus)

Respective solutions of the resist underlayer film-forming compositions prepared in Examples 1 to 21 and Comparative Examples 1 to 6 were applied on a silicon wafer using a spin coater, and the applied solutions were baked on a hot plate at 400° C. for 90 seconds to form resist underlayer films (film thickness of 0.20 μm). To determine the hardness and the Young's modulus for these resist underlayer films, evaluation was conducted using an indentation tester (manufactured by TOYO Corporation). The results are shown in Tables below.

TABLE 6

|  |  | Hardness (GPa) | Young's modulus (GPa) |
|---|---|---|---|
| Example 1 | Film baked at 400° C. | 0.65 | 8.3 |
| Example 2 | Film baked at 400° C. | 0.68 | 8.5 |
| Example 3 | Film baked at 400° C. | 0.54 | 8.0 |
| Example 4 | Film baked at 400° C. | 0.71 | 8.9 |
| Example 5 | Film baked at 400° C. | 0.68 | 8.8 |
| Example 6 | Film baked at 400° C. | 0.45 | 6.8 |
| Example 7 | Film baked at 400° C. | 0.71 | 8.9 |
| Example 8 | Film baked at 400° C. | 0.63 | 8.4 |
| Example 9 | Film baked at 400° C. | 0.70 | 9.0 |
| Example 10 | Film baked at 400° C. | 0.70 | 10.6 |
| Example 11 | Film baked at 400° C. | 0.65 | 10.2 |
| Example 12 | Film baked at 400° C. | 0.70 | 10.4 |
| Example 13 | Film baked at 400° C. | 0.56 | 8.6 |
| Example 14 | Film baked at 400° C. | 0.15 | 3.3 |

TABLE 7

|  |  | Hardness (GPa) | Young's modulus (GPa) |
|---|---|---|---|
| Example 15 | Film baked at 400° C. | 0.68 | 10.5 |
| Example 16 | Film baked at 400° C. | 0.69 | 11.1 |
| Example 17 | Film baked at 400° C. | 0.72 | 11.2 |
| Example 18 | Film baked at 400° C. | 0.73 | 11.2 |
| Example 19 | Film baked at 400° C. | 0.54 | 8.9 |

TABLE 7-continued

|  |  | Hardness (GPa) | Young's modulus (GPa) |
|---|---|---|---|
| Example 20 | Film baked at 400° C. | 0.58 | 9.0 |
| Example 21 | Film baked at 400° C. | 0.59 | 9.5 |
| Comparative Example 1 | Film baked at 400° C. | 0.50 | 8.2 |
| Comparative Example 2 | Film baked at 400° C. | 0.50 | 8.9 |
| Comparative Example 3 | Film baked at 400° C. | 0.51 | 8.4 |
| Comparative Example 4 | Film baked at 400° C. | 0.52 | 7.6 |
| Comparative Example 5 | Film baked at 400° C. | 0.51 | 9.5 |
| Comparative Example 6 | Film baked at 400° C. | 0.50 | 8.9 |

(Evaluation of Wiggling Resistance)

Respective solutions of the resist underlayer film-forming compositions prepared in Examples 2, 4, and 9 and Comparative Examples 4 to 6 were applied on a silicon wafer with a silicon oxide coating film using a spin coater. The applied solutions were baked on a hot plate at 400° C. for 90 seconds to form resist underlayer films (film thickness of 200 nm). A hard mask-forming composition solution was applied on each of the resist underlayer films, and the applied solution was baked at 240° C. for 1 minute to form a silicon hard mask layer (film thickness of 30 nm). A resist solution was applied on the silicon hard mask layer, and the applied solution was baked at 100° C. for 1 minute to form a resist layer (film thickness of 150 nm). Exposure at a wavelength of 193 nm was performed using a mask, and the post exposure bake PEB (at 105° C. for 1 minute) was performed, and development was then performed to obtain a resist pattern. Thereafter, dry etching was performed with a fluorine-based gas (component is $CF_4$) to transfer the resist pattern to the hard mask. Thereafter, dry etching was performed with an oxygen-based gas (component is $O_2$) to transfer the resist pattern to the resist underlayer film of the present invention. Thereafter, dry etching was performed with a fluorine based gas (component is $C_4F_8$), and the silicon oxide coating film on the silicon wafer was removed. Each pattern shape on that occasion was observed.

Irregular curves in a pattern, called wiggling, become more likely to occur as the pattern width becomes narrower. The pattern width at which wiggling begins to occur was observed with an electron microscope by performing the above-described step using the resist underlayer film-forming compositions of Examples.

When wiggling occurs, accurate substrate processing based on a pattern cannot be performed, and therefore it is necessary to process a substrate at the pattern width immediately before the occurrence of wiggling (limit pattern width). As the limit pattern width at which wiggling begins to occur is narrower, finer substrate processing can be performed.

To measure resolution, a critical dimension scanning electron microscope (manufactured by Hitachi, Ltd.) was used. Measurement results are shown in Table below.

TABLE 8

|  |  | Wiggling (nm) |
|---|---|---|
| Example 2 | Film baked at 400° C. | 43.3 |
| Example 4 | Film baked at 400° C. | 43.5 |
| Example 9 | Film baked at 400° C. | 43.9 |
| Comparative Example 4 | Film baked at 400° C. | 47.5 |
| Comparative Example 5 | Film baked at 400° C. | 52.5 |
| Comparative Example 6 | Film baked at 400° C. | 47.1 |

When Examples 2, 4, and 9 are compared with Comparative Example 4, the film density, the hardness, and Young's modulus in Examples 2, 4, and 9 where the benzene ring that constitutes the carbazole novolak resin is substituted with two or more particular chemical groups (a), (b), and (c) are higher than those in Comparative Example 4. In addition, the wiggling resistance and the etching resistance in Examples 2, 4, and 9 are improved compared to Comparative Example 4 because the minimum pattern size at which wiggling occurs is small in proportion to the values of the film density, the hardness, and Young's modulus.

When comparison is made among Comparative Examples 4 to 6, the film density, the hardness, and Young's modulus are higher for the carbazole novolak resin (Comparative Example 4) than those for the diphenylamine novolak resin (Comparative Example 5) and the polyvalent phenol novolak resin (Comparative Example 6), and the minimum pattern size at which wiggling occurs is almost equivalent or becomes smaller in proportion to the values of the film density, the hardness, and Young's modulus. The carbazole novolak resin (Comparative Example 4) has the above-described tendency. Similarly, for the diphenylamine novolak resin (Comparative Example 5) and the polyvalent phenol novolak resin (Comparative Example 6), by allowing the benzene ring that constitutes the novolak resin to be substituted with two or more particular chemical groups (a), (b), and (c), the film density, the hardness, and Young's modulus are improved, and the minimum pattern size at which wiggling occurs becomes small in proportion to the values of the film density, the hardness, and Young's modulus, so that the wiggling resistance and the etching resistance are improved.

From those described above, by allowing the benzene ring to be substituted with two or more particular chemical groups described above, the film density, the hardness, and Young's modulus are improved, the wiggling resistance is improved accompanying the improvements in the film density, the hardness, and Young's modulus, and the etching resistance is improved. This is considered to be an effect that is common to not only resist underlayer films using a carbazole novolak resin but also to resist underlayer films using a novolak resin.

INDUSTRIAL APPLICABILITY

According to the present invention, it is possible to obtain a resist underlayer film-forming composition for forming a resist underlayer film having high film density, hardness, Young's modulus, wiggling resistance (high resistance to bending), and therefore having high etching resistance.

The invention claimed is:
1. A method for producing a resist underlayer film, the method comprising applying and baking a resist underlayer film-forming composition on a semiconductor substrate so as to obtain the resist underlayer film,
   wherein the resist underlayer film-forming composition comprises a novolak resin having a repeating unit structure consisting of the following formula (1):

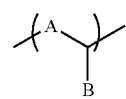

Formula (1)

wherein a group A is an organic group that includes a ring structure comprising an aromatic ring selected from the group consisting of benzene, naphthalene and diphenylamine and a group B is each independently an organic group that includes a ring structure comprising an aromatic ring, a condensed aromatic ring, or a condensed aromatic hetero ring, wherein the repeating unit structure of formula (1) further includes two or more same or different mono- or divalent chemical groups selected from the group consisting of chemical group (a) that is sulfide group, chemical group (b) that is amino group, carboxyl group, a carboxylic acid alkyl ester group, nitro group, hydroxy group, ether group, or a combination thereof, with a proviso that chemical group (b) does not include a secondary amino group, and chemical group (c) that is a fluoroalkyl group, by way of the mono- or divalent chemical groups each being substituted for a hydrogen atom bonded to a carbon atom in the ring structure of the group A and/or of the group B;

wherein, in the two or more mono- or divalent chemical groups, at least one is selected from the chemical group (b);

wherein if the group A is diphenylamine:
the amino group of the diphenylamine is one of the two or more mono- or divalent chemical groups;
chemical group (a) is a sulfide group;
chemical group (b) is a carboxylic acid alkyl ester group, an ether group, or a combination thereof; and
chemical group (c) is a fluoroalkyl group.

2. A method for producing a semiconductor device, the method comprising:

a step of forming a resist underlayer film from a resist underlayer film-forming composition on a semiconductor substrate;

a step of forming a resist film on the resist underlayer film;

a step of forming a resist pattern through irradiation with light or an electron beam and development;

a step of etching the underlayer film with the formed resist pattern; and a step of processing the semiconductor substrate with the patterned underlayer film, wherein the resist underlayer film-forming composition comprises a novolak resin having a repeating unit structure consisting of the following formula (1):

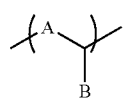

Formula (1)

wherein a group A is an organic group that includes a ring structure comprising an aromatic ring selected from the group consisting of benzene, naphthalene and diphenylamine and a group B is each independently an organic group that includes a ring structure comprising an aromatic ring, a condensed aromatic ring, or a condensed aromatic hetero ring, wherein the repeating unit structure of formula (1) further includes two or more same or different mono- or divalent chemical groups selected from the group consisting of chemical group (a) that is sulfide group, chemical group (b) that is amino group, carboxyl group, a carboxylic acid alkyl ester group, nitro group, hydroxy group, ether group, or a combination thereof, with a proviso that chemical group (b) does not include a secondary amino group, and chemical group (c) that is a fluoroalkyl group, by way of the mono- or divalent chemical groups each being substituted for a hydrogen atom bonded to a carbon atom in the ring structure of the group A and/or of the group B;

wherein, in the two or more mono- or divalent chemical groups, at least one is selected from the chemical group (b);

wherein if the group A is diphenylamine:
the amino group of the diphenylamine is one of the two or more mono- or divalent chemical groups;
chemical group (a) is a sulfide group;
chemical group (b) is a carboxylic acid alkyl ester group, an ether group, or a combination thereof; and
chemical group (c) is a fluoroalkyl group.

3. A method for producing a semiconductor device, the method comprising:

a step of forming a resist underlayer film from a resist underlayer film-forming composition on a semiconductor substrate;

a step of forming a hard mask on the resist underlayer film;

a step of further forming a resist film on the hard mask;

a step of forming a resist pattern through irradiation with light or an electron beam and development;

a step of etching the hard mask with the formed resist pattern;

a step of etching the underlayer film with the patterned hard mask; and a step of processing the semiconductor substrate with the patterned resist underlayer film, wherein the resist underlayer film-forming composition comprises a novolak resin having a repeating unit structure consisting of the following formula (1):

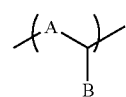

Formula (1)

wherein a group A is an organic group that includes a ring structure comprising an aromatic ring selected from the group consisting of benzene, naphthalene and diphenylamine and a group B is each independently an organic group that includes a ring structure comprising an aromatic ring, a condensed aromatic ring, or a condensed aromatic hetero ring, wherein the repeating unit structure of formula (1) further includes two or more same or different mono- or divalent chemical groups selected from the group consisting of chemical group (a) that is sulfide group, chemical group (b) that is amino group, carboxyl group, a carboxylic acid alkyl ester group, nitro group, hydroxy group, ether group, or a combination thereof, with a proviso that chemical group (b) does not include a secondary amino group, and chemical group (c) that is a fluoroalkyl group, by way of the mono- or divalent chemical groups each being substituted for a hydrogen atom bonded to a carbon atom in the ring structure of the group A and/or of the group B;

wherein, in the two or more mono- or divalent chemical groups, at least one is selected from the chemical group (b);

wherein if the group A is diphenylamine:
the amino group of the diphenylamine is one of the two or more mono- or divalent chemical groups; and chemical group (a) is a sulfide group;
chemical group (b) is a carboxylic acid alkyl ester group, an ether group, or a combination thereof; and
chemical group (c) is a fluoroalkyl group.

4. A resist underlayer film-forming composition comprising a novolak resin having a repeating unit structure selected from the group consisting of:

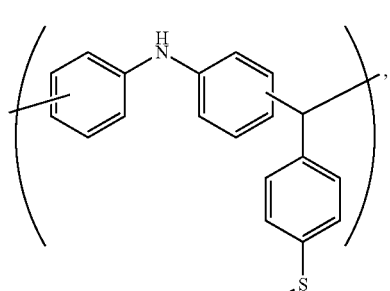

Formula (1-12)

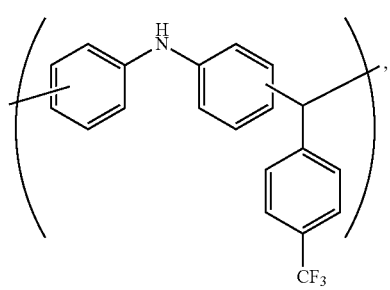

Formula (1-14)

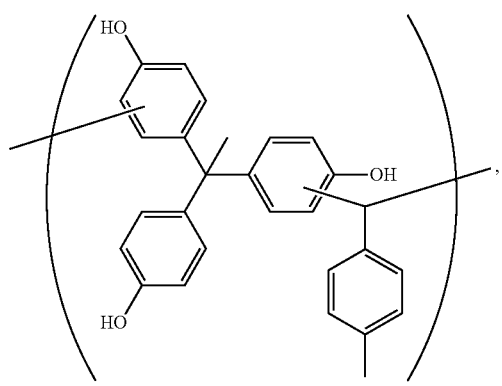

Formula (1-15)

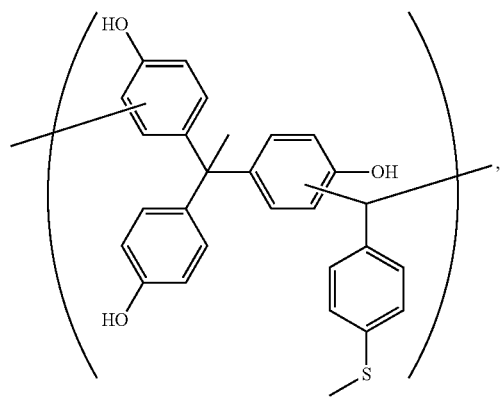

Formula (1-17)

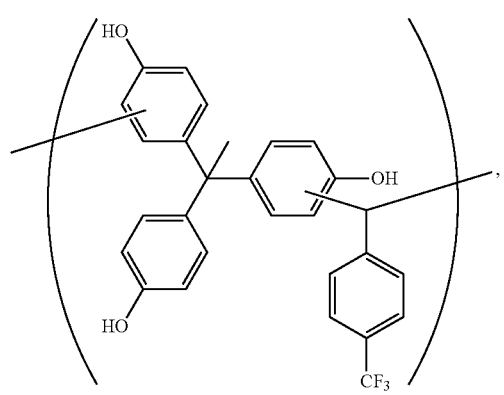

Formula (1-19)

and

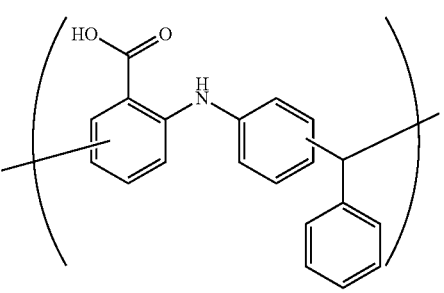

Formula (1-20)

* * * * *